United States Patent
Kang et al.

(10) Patent No.: US 8,653,211 B2
(45) Date of Patent: Feb. 18, 2014

(54) RANDOM COPOLYMER FOR FORMING NEUTRAL SURFACE AND METHODS OF MANUFACTURING AND USING THE SAME

(75) Inventors: Min-Hyuck Kang, Seoul (KR); Su-Mi Lee, Hwaseong-si (KR); Eun-Ae Kwak, Gunpo-si (KR); Moon-Gyu Lee, Suwon-si (KR); Bong-Jin Moon, Goyang-si (KR); Suk-Ho Kim, Seoul (KR); Ju-Hee Kim, Gunpo-si (KR); Won-Tae Joo, Seoul (KR)

(73) Assignees: Samsung Display Co., Ltd. (KR); Industry-University Cooperation Foundation Sogang University (KR)

( * ) Notice: Subject to any disclaimer, the term of this patent is extended or adjusted under 35 U.S.C. 154(b) by 0 days.

(21) Appl. No.: 13/459,588

(22) Filed: Apr. 30, 2012

(65) Prior Publication Data

US 2012/0273460 A1    Nov. 1, 2012

(30) Foreign Application Priority Data

Apr. 29, 2011    (KR) .................... 10-2011-0040942

(51) Int. Cl.
*C08F 4/32* (2006.01)
*C08F 12/08* (2006.01)
*C08F 120/20* (2006.01)

(52) U.S. Cl.
USPC ........... 526/204; 526/193; 526/220; 526/258; 526/274

(58) Field of Classification Search
USPC .................... 526/193, 220, 274, 258, 204
See application file for complete search history.

(56) References Cited

U.S. PATENT DOCUMENTS

| 4,788,176 | A | 11/1988 | Wieserman et al. |
| 7,816,671 | B2 | 10/2010 | Park et al. |
| 2009/0324839 | A1 | 12/2009 | Klippel et al. |
| 2010/0027192 | A1 | 2/2010 | Perry et al. |
| 2010/0227252 | A1 | 9/2010 | Kiefer et al. |

OTHER PUBLICATIONS

Mansky, P. et al "Controlling Polymer Surface Interactions with Random Copolymer Brushes", Mar. 7, 1997, Science, vol. 275, p. 1458-1460.*

Hanson, E. L., et al., "Bonding Self-Assembled, Compact Organophosphonate Monolayers to the Native Oxide Surface of Silicon", JACS Articles, Nov. 25, 2003, pp. 16074-16080, vol. 125, No. 51, J. Am. Chem. Soc.
In I., et al., "Side-Chain-Grafted RAndom Copolymer Brushes as Neutral Surfaces for Controlling the Orientation of Block Copolymer Microdomains in Thin Films", Langmuir 2006, vol. 22, No. 18, pp. 7855-7860, Jun. 8, 2006, American Chemical Society.
Kim, B. Y. et al., "Ferrocene Functional Polymer Brushes on Indium Tin Oxide via Surface-Initiated Atom Transfer RAdical Polymerization", Langmuir Article, 2009 American Chemical Society, Oct. 21, 2009, pp. 2083-2092, 26(3), pubs.acs.org/Langmuir.
Mansky, P., "Controlling Polymer-Surface Interactions with Random Copolymer Brushes", Science, Mar. 7, 1997, pp. 1458-1460, vol. 275.
Zschieschang U, et al., "Mixed Self-Assembled Monolayers Gate Dielectrics for Continuous Threshold Voltage Control in Organic Transistors and Circuits", Advanced Material 2010, vol. 22, pp. 4489-4493.

* cited by examiner

*Primary Examiner* — Ling Choi
*Assistant Examiner* — David L Miller
(74) *Attorney, Agent, or Firm* — Cantor Colburn LLP

(57) ABSTRACT

A random copolymer having a structure represented by the following Formula 1:

Formula 1

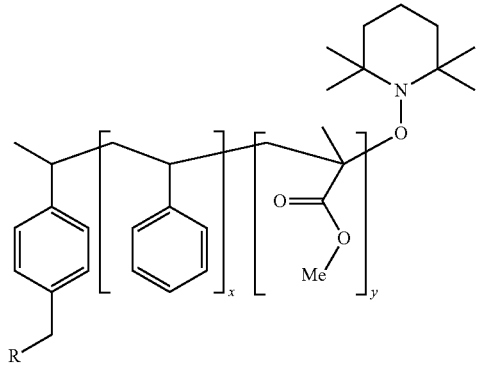

wherein R is phosphonic acid, Me is a methyl group, x is a number of styrene units, and y is a number of methyl methacrylate units.

34 Claims, 21 Drawing Sheets

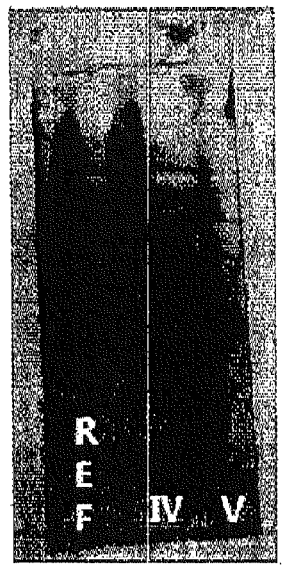
FIG.7
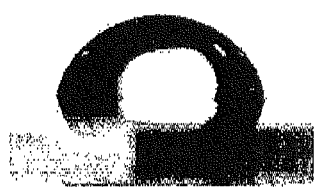 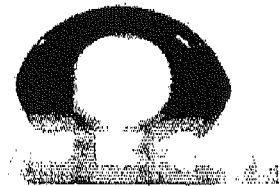
FIG.8A     FIG.8B

RANDOM COPOLYMER FOR FORMING NEUTRAL SURFACE AND METHODS OF MANUFACTURING AND USING THE SAME

CROSS-REFERENCE TO RELATED APPLICATION

This application claims priority to Korean Patent Application No. 10-2011-0040942, filed Apr. 29, 2011, and all the benefits accruing therefrom under 35 U.S.C. §119, the content of which in its entirety is incorporated herein by reference.

BACKGROUND

1. Field

This disclosure relates to a random copolymer capable of forming a neutral surface, and methods of manufacturing and using the same. In particular, disclosed is a random copolymer capable of stably attaching to a substrate or particles and rapidly forming a neutral surface on which a block copolymer can be stably arranged, and a method of manufacturing the same.

2. Description of the Related Art

Block copolymers composed of two or more different homopolymers or monomers whose ends are bound to each other can self-assemble to form periodic structures having a size of several tens of nanometers. In order to achieve the self-assembly, the block copolymers require a driving force. When the block copolymers are treated with various driving forces from techniques such as thermal annealing (e.g., in a vacuum or in the atmosphere of an inert gas such as nitrogen or argon), infrared annealing, laser annealing, or solvent vapor-assisted annealing, phase separation occurs between two or more block components of the block copolymers, resulting in self-assembly of the block components into a regular pattern having repeating structural units. In particular, a diblock copolymer may include two monomers A and B having different chemical properties, which may be represented by "A-b-B." In the case of the diblock copolymer, when phase separation between the different block components A and B is caused in the copolymer, self-assembled periodic patterns including repeating structural units such as spheres, cylinders, lamellae and perpendicular lamellae can form. Ultrafine patterns having a size of several tens of nanometers may be formed using the self-assembly of block copolymers, and the technique can be applied to semiconductor devices and liquid crystal display panels, all of which use ultrafine patterning.

A neutral layer having a neutral surface, on which block copolymers can be easily self-assembled at a large scale into perpendicular lamellae or perpendicular cylinders, is desired for forming an ultrafine pattern. Such a neutral layer is a layer that is non-preferentially wetted with respect to any block, for example one of blocks A and B from the diblock copolymer A-b-B. A surface of the neutral layer has substantially the same surface affinity to the other block components of the block copolymer. Therefore, such a surface is referred to as a neutral surface or non-preferential surface.

Currently available neutral layers are annealed for approximately 6 hours to approximately 24 hours to form the neutral layer. The annealing time used to form such a neutral layer degrades desirable properties, resulting in a loss of productivity and processability in the manufacture of a neutral layer or a nanopattern substrate. Therefore, there remains a need for an improved random copolymer to provide a neutral layer with improved properties.

SUMMARY

Disclosed is a random copolymer for rapidly forming a neutral layer on an underlying layer, a substrate, or particles, and a method of manufacturing and using the same.

Also disclosed is a neutral layer including the random copolymer and a method of manufacturing the same.

Also disclosed is a nanopattern substrate including the random copolymer and a method of manufacturing the same.

In order to solve the above and other problems, an aspect provides a random copolymer including a structure represented by the following Formula 1,

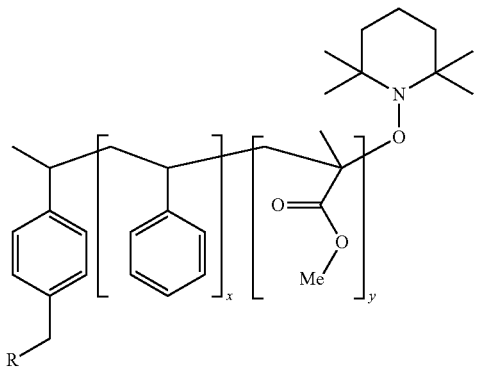

Formula 1 wherein R is phosphonic acid, Me is a methyl group, x is a number of styrene units, and y is a number of methyl methacrylate units.

The random copolymer may have a number average molecular weight (Mn) of approximately 5,000 to approximately 20,000 Daltons.

The random copolymer may have a weight average molecular weight (Mw) of approximately 5,000 to approximately 20,000 Daltons.

The random copolymer may have a polydispersity index (PDI) of approximately 1.0 to approximately 2.0.

In the random copolymer, x and y may be present in a number ratio of approximately 40 to approximately 60 to approximately 60 to approximately 40.

Another aspect provides a method of manufacturing a random copolymer, the method including manufacturing a phosphonic acid precursor, manufacturing a first nitroxide initiator for nitroxide-mediated radical polymerization (NMRP), manufacturing a second nitroxide initiator including a product of the phosphonic acid precursor by contacting the phosphonic acid precursor and the first nitroxide initiator, manufacturing a precursor of a phosphonic acid polystyrene ("PS")-poly(methyl methacrylate) ("PMMA") random copolymer by contacting the second nitroxide initiator, a styrene unit precursor, and a methyl methacrylate unit precursor, and deprotecting the precursor of the phosphonic acid polystyrene-poly(methyl methacrylate) random copolymer to manufacture the phosphonic acid PS-PMMA random copolymer.

In the method, the second nitroxide initiator may be synthesized by reacting the phosphonic acid precursor and the first nitroxide initiator.

In the method, the phosphonic acid precursor may be bis[2-(trimethylsilyl)ethyl] phosphonate.

In the method, the bis[2-(trimethylsilyl)ethyl] phosphonate may be a product of 2-(trimethylsilyl) ethanol and phosphorus trichloride ($PCl_3$).

In the method, the first nitroxide initiator may be 1-[1-(4-chloromethylphenyl)ethoxy]-2,2,6,6-tetramethyl-piperidine.

In the method, the 1-[1-(4-chloromethylphenyl)ethoxy]-2,2,6,6-tetramethyl-piperidine may be a product of 4-vinylbenzyl chloride, 2,2,6,6-tetramethylpiperidinyloxy ("TEMPO") and di-tert-butylperoxide.

In the method, the second nitroxide initiator may be {4-[1-(2,2,6,6-tetramethyl-piperidine-1-yloxy)-ethyl]-benzyl}-phosphonic acid bis-(2-trimethylsilylethyl) ester.

In the method, the {4-[1-(2,2,6,6-tetramethyl-piperidine-1-yloxy)-ethyl]-benzyl}-phosphonic acid bis-(2-trimethylsilylethyl) ester may be a product of bis[2-(trimethylsilyl)ethyl] phosphonate and 1-[1-(4-chloromethylphenyl)ethoxy]-2,2,6,6-tetramethyl-piperidine.

In the method, the precursor of the phosphonic acid PS-PMMA random copolymer may be a bis[2-(trimethylsilyl)ethyl] phosphonate PS-PMMA random copolymer.

In the method, the bis[2-(trimethylsilyl)ethyl] phosphonate PS-PMMA random copolymer may be a product of {4-[1-(2,2,6,6-tetramethyl-piperidine-1-yloxy)-ethyl]-benzyl}-phosphonic acid bis-(2-trimethylsilylethyl) ester, styrene and methyl methacrylate.

The method may include dissolving the bis[2-(trimethylsilyl)ethyl] phosphonate PS-PMMA random copolymer in dichloromethane ("DCM") to manufacture the phosphonic acid PS-PMMA random copolymer.

Still another aspect provides a method of manufacturing a nanopattern substrate, including: disposing a metal layer on a substrate, forming a neutral layer including a random copolymer represented by Formula 1 on the metal layer,

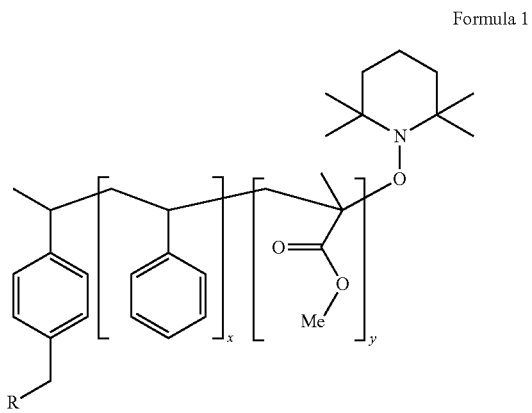

Formula 1 wherein R is phosphonic acid, Me is a methyl group, x is a number of styrene units, and y is a number of methyl methacrylate units; disposing a first block copolymer including a first block and a second block on the neutral layer; forming a first nanostructure corresponding to first nanoblocks including the first blocks and second nanoblocks including the second blocks, and patterning the metal layer in substantially a same shape as the first nanoblocks or the second nanoblocks.

In the method, x and y may be present in a number ratio of approximately 40 to approximately 60 to approximately 60 to approximately 40.

The method of manufacturing a nanopattern substrate may further include disposing an insulation layer on the metal layer; and forming partition patterns on the neutral layer.

In the method of manufacturing a nanopattern substrate, the first nanostructure may include a perpendicular lamellar shape which may be formed between the partition patterns.

The method of manufacturing a nanopattern substrate may further include forming a first neutral layer pattern which is substantially the same as a first nanoblock pattern or a second nanoblock pattern formed by a first etching process which includes etching the first nanoblocks or the second nanoblocks.

The method of manufacturing a nanopattern substrate may further include removing the partition patterns and the first nanostructure, and exposing a surface of the first neutral layer pattern to form an exposed first neutral layer pattern and insulation layer.

The method of manufacturing a nanopattern substrate may further include forming a second block copolymer including a third block and a fourth block on the exposed first neutral layer pattern and the insulation layer.

The method of manufacturing a nanopattern substrate may further include forming a second nanostructure which corresponds to the third nanoblocks including the third blocks and fourth nanoblocks including the fourth blocks.

In the method of manufacturing a nanopattern substrate, the third blocks may be formed at a position at which at least one of the first nanoblocks is formed.

The method of manufacturing a nanopattern substrate may further include forming a second neutral layer pattern which is substantially the same as a third nanoblock pattern or a fourth nanoblock pattern by a second etching process which includes etching the third nanoblocks or the fourth nanoblocks.

The method of manufacturing a nanopattern substrate may further include forming an insulation layer pattern on the insulation layer having substantially the same pattern as the second neutral layer pattern.

The method of manufacturing a nanopattern substrate may further include forming a metal pattern on the metal layer having substantially the same pattern as the insulation layer pattern.

Yet another aspect provides a method of forming a neutral layer including a random copolymer, the method including: dissolving a random copolymer having a structure represented by Formula 1 in a solvent to form a solution,

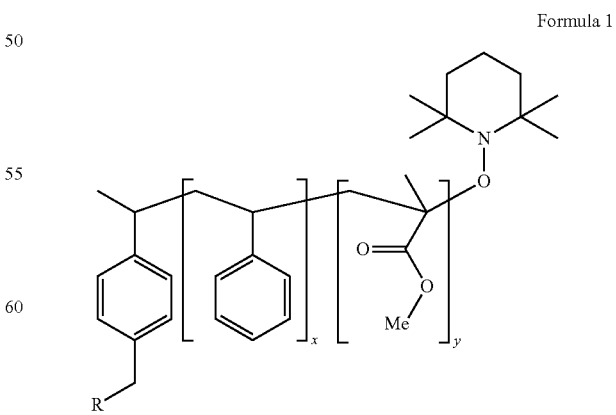

Formula 1 wherein R is phosphonic acid, Me is a methyl group, x is a number of styrene units, and y is a number of methyl methacrylate units; coating the solution of the dissolved random copolymer on a substrate to form a coating, and annealing the coating to neutralize a surface of the coating to form the neutral layer.

In the method of forming a neutral layer including a random copolymer having the structure represented by Formula 1, the solvent may be at least one selected from propyleneglycol methylether acetate ("PMA"), tetrahydrofuran ("THF"), dichloromethane ("$CH_2Cl_2$"), acetone, toluene, benzene, xylene, propylene glycol monomethyl ether acetate ("PGMEA"), dimethyl sulfoxide ("DMSO"), dimethylformamide ("DMF"), anisole and mixtures thereof.

In the method of forming a neutral layer including a random copolymer having the structure represented by Formula 1, the random copolymer may be dissolved in the PMA at a concentration of approximately 1 wt %, based on a total weight of the solution.

In the method of forming a neutral layer including a random copolymer having the structure represented by Formula 1, the annealing step may be performed at approximately 100° C. or higher.

In the method of forming a neutral layer including a random copolymer having the structure represented by Formula 1, the annealing step may be performed at approximately 160° C.

The method of forming a neutral layer including a random copolymer having the structure represented by Formula 1 may further include washing the surface of the random copolymer formed in the annealing step with an organic solvent.

BRIEF DESCRIPTION OF THE DRAWINGS

The above and other features, aspects, and advantages will become more apparent to those of ordinary skill in the art by describing in detail exemplary embodiments thereof with reference to the attached drawings, in which:

FIG. 7 shows the results of analyzing compound N and compound V synthesized in Schemes 4 and 5 by thin layer chromatography ("TLC");

FIGS. 8A to 8C show a contact angle and thickness of a neutral layer formed from the phosphonic acid PS-PMMA random copolymer;

DETAILED DESCRIPTION

Figure 1:
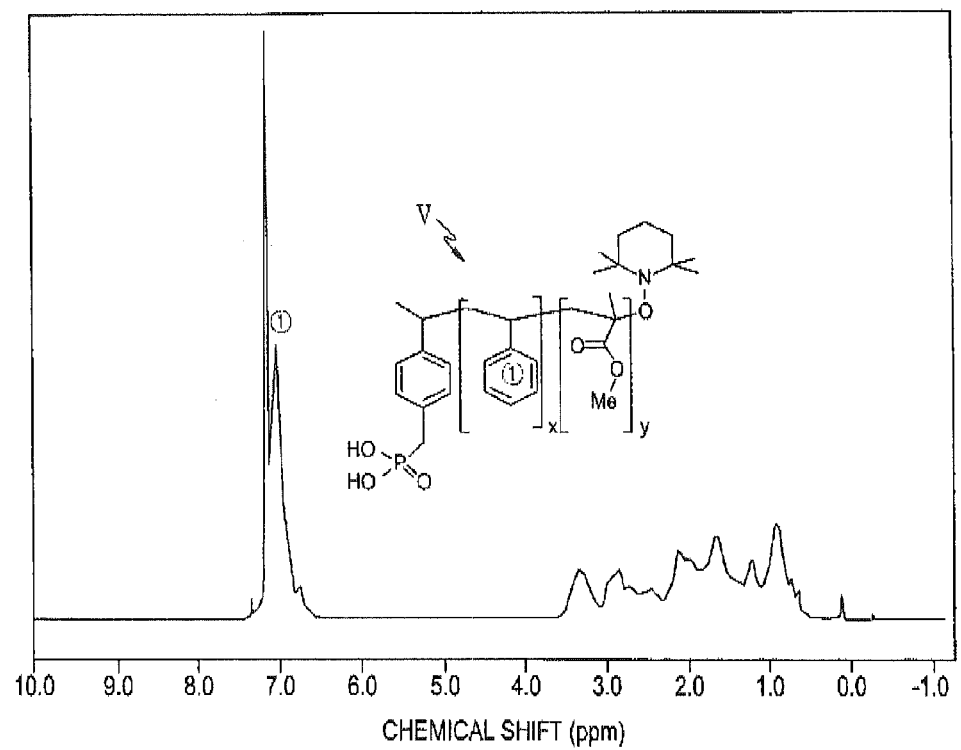
FIG. 1 is a $^1$H nuclear magnetic resonance ($^1$H-NMR) spectrum for a phosphonic acid PS-PMMA random copolymer, in which a structure of the phosphonic acid PS-PMMA random copolymer is shown.

Hereinafter, exemplary embodiments will be disclosed in further detail. However, the present disclosure is not limited to the embodiments disclosed below, but can be implemented in various forms. The following embodiments are described in order to enable those of ordinary skill in the art to embody and practice the disclosed embodiments.

Although the terms first, second, etc. may be used to describe various elements, these elements are not limited by these terms. These terms are only used to distinguish one element from another. For example, a first element could be termed a second element, and, similarly, a second element could be termed a first element, without departing from the scope of exemplary embodiments. The term "and/or" includes any and all combinations of one or more of the associated listed items. It will be understood that when an element is referred to as being "on" another element, it can be directly on the other element or intervening elements may be present therebetween. In contrast, when an element is referred to as being "directly on" another element, there are no intervening elements present.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of exemplary embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

With reference to the appended drawings, exemplary embodiments will be described in detail below. To aid in understanding, like numbers refer to like elements throughout the description of the figures, and the description of the same elements will be not reiterated.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a $^1$H nuclear magnetic resonance ($^1$H-NMR) spectrum for a phosphonic acid polystyrene ("PS")-poly(methyl methacrylate) ("PMMA") random copolymer showing a structure of the phosphonic acid PS-PMMA random copolymer. The phosphonic acid PS-PMMA random copolymer has a number average molecular weight (Mn) of approximately 5,000 to approximately 20,000 Daltons, a weight average molecular weight (Mw) of approximately 5,000 to approximately 20,000 Daltons, and a polydispersity index ("PDI") of approximately 1.0 to approximately 2.0, which is represented by a value of weight average molecular weight (Mw)/number average molecular weight (Mn). Also, since the phosphonic acid PS-PMMA random copolymer has a phosphonic acid bound to the end thereof, the phosphonic acid PS-PMMA random copolymer formed on surfaces of a substrate or particles, for example, surfaces of a metal oxide or silicon oxide, is rapidly formed into a neutral layer by rapidly forming a covalent bond through an interfacial dehydration reaction.

Since an alkyl phosphonic acid bound to the phosphonic acid PS-PMMA random copolymer has three oxygen (O) atoms bound to the end thereof and is acidic, the alkyl phosphonic acid strongly binds to the surfaces of the metal oxide or silicon oxide as a tridentate. In addition, since a bond of metal (M)-O-phosphorus (P) is very strong, and is relatively stable to hydrolysis, the neutral layer has excellent stability. The phosphonic acid PS-PMMA random copolymer binds to the substrate or particles at approximately 100° C. to approximately 200° C. under a vacuum or inert gas atmosphere so that the surfaces of the substrate or particles can be neutralized within approximately 15 minutes. The $^1$H-NMR analysis results of the phosphonic acid PS-PMMA random copolymer as shown in FIG. 1 will be described later in further detail with reference to the following Scheme 5.

Hereinafter, referring to FIG. 1, a structure of the phosphonic acid PS-PMMA random copolymer 1 will be described in further detail. The main chain of the phosphonic acid PS-PMMA random copolymer is formed by randomly binding a number of styrene units ("PS"s) and a number of methyl methacrylate units ("MMA"s) to each other. One end of the phosphonic acid PS-PMMA random copolymer binds to a first benzene ring at a $1^{st}$ position of the first benzene ring, and the other end bonds to a nitroxide group. A phosphonic acid binds to a $4^{th}$ position of the first benzene ring. Since the phosphonic acid has higher reactivity with the surfaces of the substrate or particles, compared to a hydroxyl group, the phosphonic acid may rapidly bind to the substrate or particles. The nitroxide group bound to the other end of the random copolymer is used as an initiator to synthesize the phosphonic acid PS-PMMA random copolymer through a nitroxide-mediated radical polymerization ("NMRP") reaction, as will be described later with reference to Scheme 4. The nitroxide initiator has an advantage of uniformly synthesizing copolymers so that they have uniform molecular weights. That is, the nitroxide initiator may be used to synthesize a copolymer having a high polydispersity index ("PDI"). The PDI represents how uniformly the molecular weights of polymers are distributed, and thus the molecular weights of the polymers are uniformly distributed when the PDI exceeds 1 or approaches 1.

In order to form the main chain of the random copolymer, polystyrene (PS) and methyl methacrylate (MMA) are randomly bound to each other in ratios of approximately 40 to approximately 60 to approximately 40 to approximately 60, respectively, specifically approximately 45 to approximately 55 to approximately 55 to approximately 45, more specifically approximately 50 to approximately 50. The phosphonic acid PS-PMMA random copolymer formed at such a ratio may be satisfactorily surface-modified into a neutral state. In an embodiment, the PS and the MMA may be bound to each other at a number ratio of approximately 56 to approximately 44. Therefore, the phosphonic acid PS-PMMA random copolymer as shown in FIG. 1 is used as a material of the neutral layer to prevent blocks of the diblock copolymer from being preferentially wetted on the random copolymer.

Hereinafter, a method of manufacturing a random copolymer including a phosphonic acid as shown in FIG. 1 will be described in further detail with reference to FIGS. 2 to 6 and Schemes 1 to 5 as will be further described later.

First Synthesis Method

Figure 2:
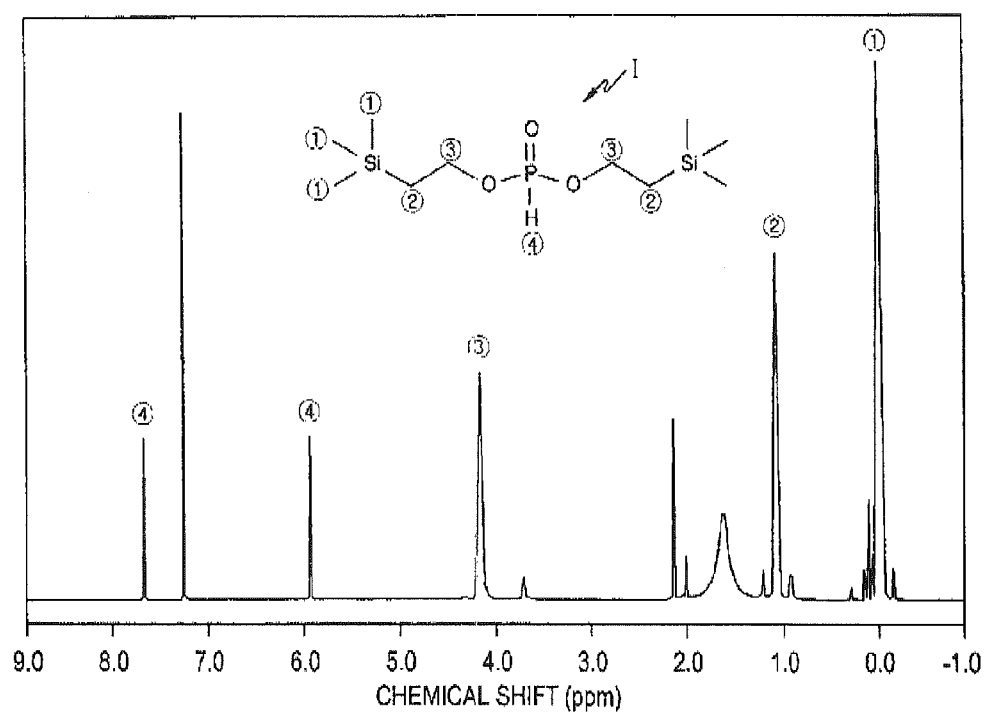
FIG. 2 is a $^1$H-NMR analysis spectrum for bis[2-(trimethylsilyl)ethyl] phosphonate (I) synthesized in Scheme 1.

First, a method of manufacturing a phosphonic acid precursor, e.g., bis[2-(trimethylsilyl)ethyl] phosphonate, and a structure of the phosphonic acid precursor will be described in further detail with reference to Scheme 1 and FIG. 2. Scheme 1 is designed to manufacture bis[2-(trimethylsilyl)ethyl] phosphonate. FIG. 2 is a $^1$H-NMR spectrum for the bis[2-(trimethylsilyl)ethyl] phosphonate (I) synthesized in Scheme 1.

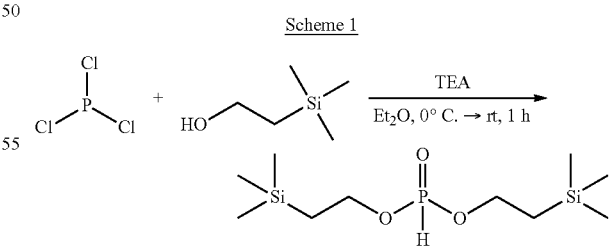

Scheme 1

2-(trimethylsilyl) ethanol (2.00 milliliters (ml), 14.0 millimoles (mmol)) and anhydrous triethylamine ("TEA") (1.95 ml, 14.0 mmol) are dissolved in diethyl ether (Et$_2$O) (30 ml) at 0° C. to manufacture a solution I-1. Distilled phosphorus trichloride (PCl$_3$) (0.41 ml, 4.67 mmol) is slowly added to anhydrous ether (Et$_2$O) (10 ml) to manufacture a second solution I-2. The solutions I-1 and I-2 are stirred for approximately 2 hours under a nitrogen atmosphere at 0° C. to manufacture a non-purified bis[2-(trimethylsilyl)ethyl] phosphonate solution. Hereinafter, a process of purifying the bis[2-(trimethylsilyl)ethyl] phosphonate will be described in further detail. When the bis[2-(trimethylsilyl)ethyl] phosphonate solution is warmed to room temperature and filtered, a white precipitate including the bis[2-(trimethylsilyl)ethyl] phosphonate is obtained. The white precipitate is washed with ether and distilled water. The washed white precipitate is stirred for approximately 1 hour in distilled water (15 ml) at approximately 35° C., filtered together with distilled water, and then dried over magnesium sulfate. When the dried white precipitate is condensed under a vacuum, a colorless oil (compound I) as shown in Scheme 1 is synthesized (yield: 1.34 g, 100%). Compound I as shown in FIG. 2 is bis[2-(trimethylsilyl)ethyl] phosphonate.

Compound I synthesized in Scheme 1 is analyzed with reference to FIG. 2. FIG. 2 shows a $^1$H-NMR spectrum for compound I. In the $^1$H-NMR spectrum, the X axis represents a chemical shift (hereinafter referred to as "δ," in parts per million (ppm)) of a certain atomic nucleus, and the Y axis represents a magnetic field intensity. For the NMR analysis, compound I is dissolved in a solvent such as deuterated chloroform (CDCl$_3$). An NMR spectrometer is run at 400 MHz.

As shown in FIG. 2, the NMR analysis results for compound I are as follows: $^1$H-NMR (400 MHz, CDCl$_3$): δ=0.05 (s, 18H, CH$_3$), δ=1.11 (t, J=8.8 Hz, 4H, SiCH$_2$), δ=4.18 (m, $J_{HH}$=10.4 Hz, $J_{HP}$=8.4 Hz, 4H, OCH$_2$), and δ=6.807 (d, $J_{HP}$=688 Hz, 1H, O=PH). Here, s represents a singlet, t represents a triplet, d represents a doublet, dd represents a doublet of a doublet, and m represents a multiplet. In particular, it is confirmed that an alcohol is substituted with ester through a multiple peak observed at 4.18 ppm, and hydrogen (H) is coupled to phosphorus (P) to provide a double peak observed at 6.807 ppm. Therefore, the NMR analysis results confirm that compound I synthesized in Scheme 1 is bis[2-(trimethylsilyl)ethyl] phosphonate containing silyl ethyl ethers bound to both ends of phosphonate.

Second Synthesis Method

Figure 3:
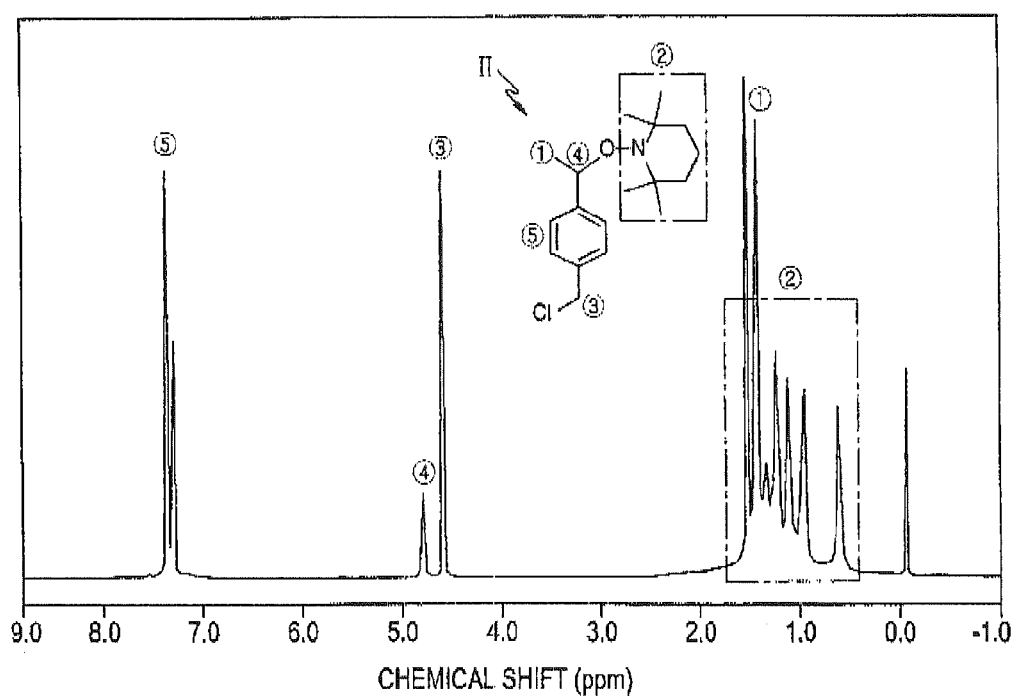
FIG. 3 is a $^1$H-NMR analysis spectrum for 1-[1-(4-chloromethylphenyl)ethoxy]-2,2,6,6-tetramethyl-piperidine (II) synthesized in Scheme 2.

Hereinafter, a method of manufacturing a nitroxide initiator, e.g., 1-[1-(4-chloromethylphenyl)ethoxy]-2,2,6,6-tetramethyl-piperidine, and a structure of the nitroxide initiator will be described in further detail with reference to Scheme 2 and FIG. 3. Scheme 2 is designed to manufacture the nitroxide initiator, 1-[1-(4-chloromethylphenyl)ethoxy]-2,2,6,6-tetramethyl-piperidine (II), for NMRP as will be described later with reference to Scheme 4. FIG. 3 shows the $^1$H-NMR spectrum for 1-[1-(4-chloromethylphenyl)ethoxy]-2,2,6,6-tetramethyl-piperidine (II) synthesized in Scheme 2.

Scheme 2

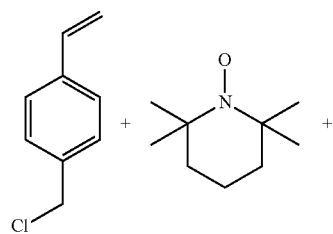

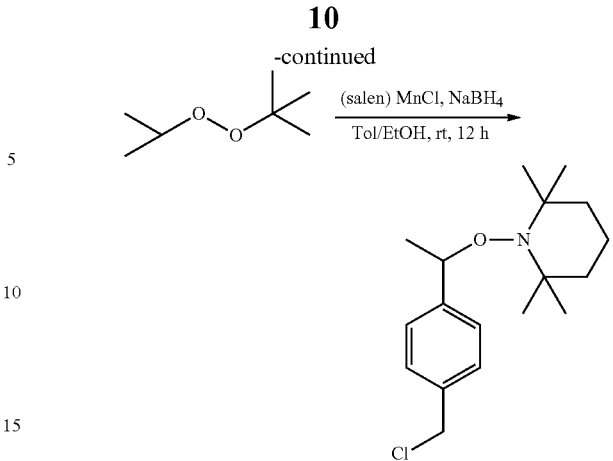

4-vinylbenzyl chloride (2.15 g, 12.8 mmol) and 2,2,6,6-tetramethylpiperidinyloxy ("TEMPO") (2 g, 12.8 mmol) are dissolved in a mixed solution of toluene ("Tol") and ethanol (EtOH) to manufacture a solution II-1. [N,N'-bis(3,5-di-tert-butyl salicylidene)-1,2-cyclohexanediaminoato]manganese chloride ("(salen)MnCl") (1.2 g, 1.92 mmol), di-tert-butylperoxide (2.53 ml, 12.8 mmol) and sodium borohydride (0.968 g, 25.6 mmol) are added to the solution II-1, and mixed at room temperature for approximately 12 hours while stirring, thereby manufacturing a reaction mixture II-2. Thereafter, an organic solvent is removed from the reaction mixture II-2, which is then washed with a mixed solution of dichloromethane and 10% hydrochloric acid (HCl). Then, when the reaction mixture II-2 is dried over anhydrous magnesium sulfate (MgSO$_4$), non-purified 1-[1-(4-chloromethylphenyl)ethoxy]-2,2,6,6-tetramethyl-piperidine is manufactured.

The non-purified 1-[1-(4-chloromethylphenyl)ethoxy]-2,2,6,6-tetramethyl-piperidine is filtered with a solution of dichloromethane and hexane (mixing ratio: approximately 1:9) using silica gel chromatography (i.e., flash chromatography), and purified with a solution of dichloromethane and hexane (mixing ratio: approximately 1:2) to synthesize a white solid (compound II) (2.55 g, 64%) as shown in FIG. 3. Compound II is 1-[1-(4-chloromethylphenyl)ethoxy]-2,2,6,6-tetramethyl-piperidine.

Compound II synthesized in Scheme 2 is analyzed with reference to FIG. 3. FIG. 3 shows a $^1$H-NMR spectrum for the synthesized compound II. As shown in FIG. 3, the NMR analysis results of the synthesized compound II are as follows; $^1$H-NMR (400 MHz, CDCl$_3$): δ 0.67, 1.03, 1.16, 1.29 (br s, 12H, CH$_3$), 1.47 (d, J=6.4 Hz, 3H, CH$_3$CHO), 4.59 (s, 2H, CH$_2$Cl), 4.79 (q, J=6.4 Hz, 1H, PhCH), and 7.30-7.33 (m, 4H, ArH). Here, q represents a quadruplet, and br s represents a broad singlet. In particular, it is revealed that a nitroxide group is substituted for a benzylic site bound to a $1^{st}$ position of a benzene ring through peaks observed at approximately 0.67 to 1.29 ppm. It is revealed that chloromethane (CH$_2$Cl) is bound between a $4^{th}$ position of the benzene ring and a substituted chlorine position through a single peak observed at approximately 4.59 ppm. Also, it is revealed that —CH— is bound between the $1^{st}$ position of the benzene ring and the substituted nitroxide group through a quadruple peak observed at approximately 4.79 ppm. Therefore, the NMR analysis results show that compound II synthesized in Scheme 2 is 1-[1-(4-chloromethylphenyl)ethoxy]-2,2,6,6-tetramethyl-piperidine having a nitroxide group bound to a benzylic position bound to the $1^{st}$ position of the benzene ring and benzylic chloride bound to the $4^{th}$ position of the benzene ring.

The nitroxide initiator may be at least one selected from the above-described compound II and the following nitroxide initiators.
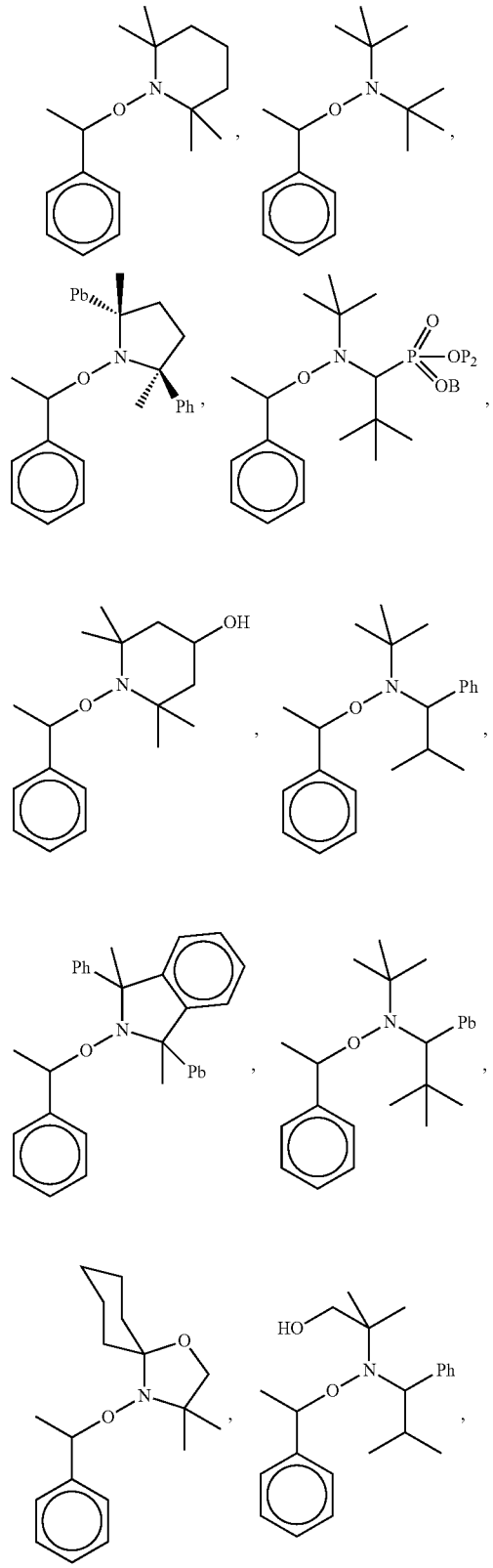
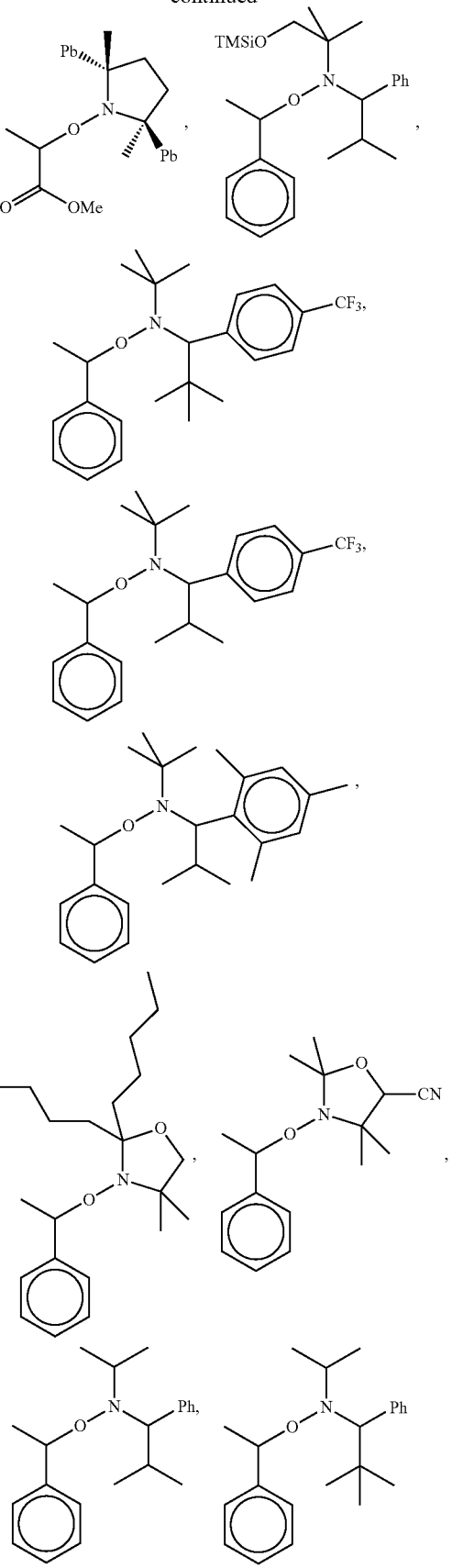

Third Synthesis Method

Figure 4:
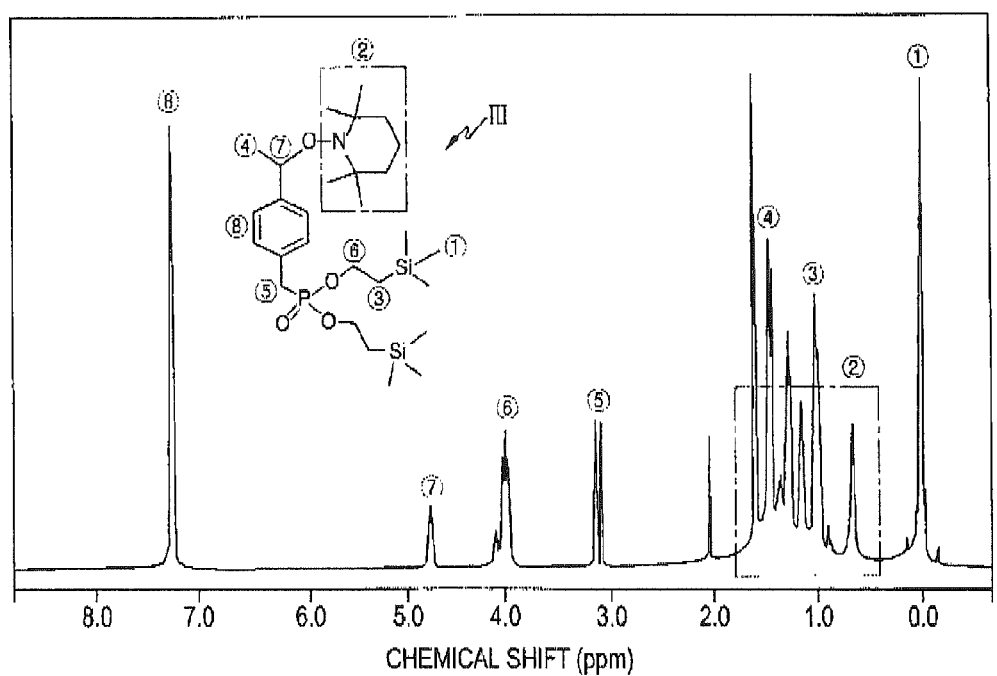
FIG. 4 is a $^1$H-NMR analysis spectrum for {4-[1-(2,2,6,6-Tetramethyl-piperidine-1-yloxy)-ethyl]-benzyl}-phosphonic acid bis-(2-trimethylsilylethyl) ester (III) synthesized in Scheme 3.

Hereinafter, a method of manufacturing a second nitroxide initiator including a phosphonic acid precursor, for example {4-[1-(2,2,6,6-tetramethyl-piperidine-1-yloxy)-ethyl]-benzyl}-phosphonic acid bis-(2-trimethylsilylethyl) ester (III), and a structure of the second nitroxide initiator will be described in further detail with reference to Scheme 3 and FIG. 4. Scheme 3 is designed to manufacture the {4-[1-(2,2,6,6-tetramethyl-piperidine-1-yloxy)-ethyl]-benzyl}-phosphonic acid bis-(2-trimethylsilylethyl) ester. FIG. 4 is a $^1$H-NMR spectrum for {4-[1-(2,2,6,6-Tetramethyl-piperidine-1-yloxy)-ethyl]-benzyl}-phosphonic acid bis-(2-trimethylsilylethyl) ester (III) synthesized in Scheme 3.

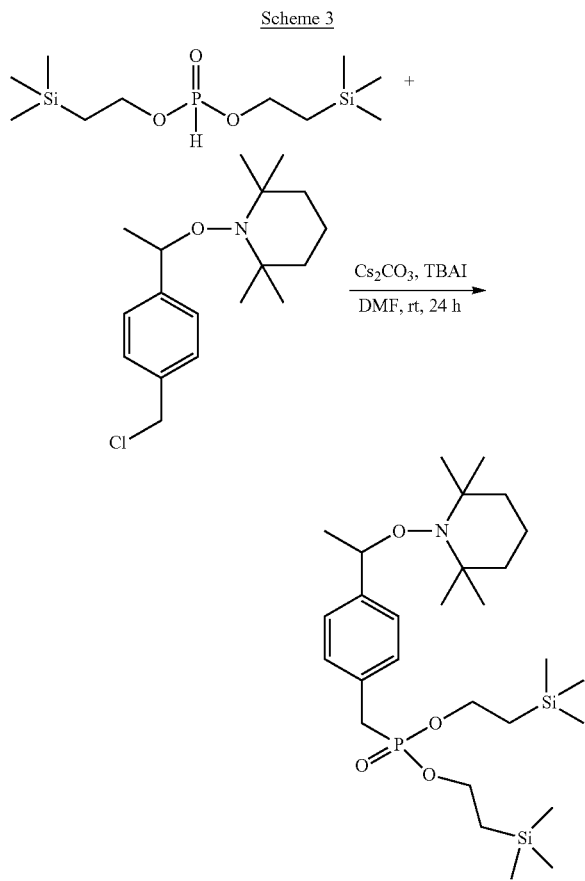

Scheme 3

Compound I, that is, bis[2-(trimethylsilyl)ethyl] phosphonate (582 mg, 2.05 mmol) is dissolved in dimethylformamide ("DMF") (25 ml) to manufacture a solution III-1. Cesium carbonate ($Cs_2CO_3$) (2 g, 6.13 mmol) and tetrabutylammonium iodide ("TBAI") (2.26 g, 6.13 mmol) are added to the solution III-1, and stirred at room temperature for approximately 1 hour under a nitrogen atmosphere to manufacture a solution III-2. After approximately 1 hour, compound II, that is, 1-[1-(4-chloromethylphenyl)ethoxy]-2,2,6,6-tetramethylpiperidine (1.9 g, 6.13 mmol), is added to the solution III-2, and stirred for approximately 24 hours to manufacture a suspension III-3. The suspension III-3 is purified with ethyl acetate ("EtOAc"), washed with distilled water, dried over anhydrous magnesium sulfate ($MgSO_4$), and then condensed under a vacuum to obtain non-purified {4-[1-(2,2,6,6-tetramethyl-piperidine-1-yloxy)-ethyl]-benzyl}-phosphonic acid bis-(2-trimethylsilylethyl) ester.

The non-purified {4-[1-(2,2,6,6-tetramethyl-piperidine-1-yloxy)-ethyl]-benzyl}-phosphonic acid bis-(2-trimethylsilylethyl) ester is purified with a solution of hexane and ethyl acetate (mixing ratio: approximately 1:3) using silica gel chromatography (i.e., flash chromatography), thereby synthesizing a yellow oil (compound III) (689 mg, 60%) shown in Scheme 3. Compound III is {4-[1-(2,2,6,6-tetramethyl-piperidine-1-yloxy)-ethyl]-benzyl}-phosphonic acid bis-(2-trimethylsilylethyl) ester.

Compound III synthesized in Scheme 3 is analyzed with reference to FIG. 4. FIG. 4 shows a $^1$H-NMR spectrum for the synthesized compound III. As shown in FIG. 4, the NMR analysis results of the synthesized compound III are as follows: $^1$H-NMR (400 MHz, $CDCl_3$): δ 0.04 (s, 18H, Si ($CH_3$)$_3$), 0.66 (br s, 3H, $CH_3$), 0.99 (m, 4H, $OCH_2CH_2Si$ ($CH_3$)$_3$), 1.02 (br s, 3H, $CH_3$), 1.16 (br s, 3H, $CH_3$), 1.27 (m, 2H, $CH_2$), 1.28 (br s, 3H, $CH_3$), 1.36 (br, 2H, $CH_2$), 1.46 (d, J=6.6 Hz, 3H, $NOCHCH_3$), 1.47 (br, 2H, $CH_2$), 3.13 (d, JPH=21.2 Hz, 2H, $ArCH_2P$), 4.03 (dt, JHH=7.2 Hz, JPH=16.8 Hz, 4H, $PO[OCH_2CH_2Si (CH_3)_2]_2$), 4.76 (q, J=6.6 Hz, 1H, PhCHON), 7.25 (br s, 4H, ArH). Here, dt represents a double triple peak, and br represents a broad peak. In particular, it is confirmed that a methyl group is bound to silicon through a single peak observed at approximately 0.04 ppm. It is confirmed that benzylic hydrogen binds to phosphonate through a double triple peak observed at approximately 4.03 ppm. Also, it is confirmed that benzylic hydrogen binds to a nitroxide group through a quadruple peak observed at approximately 4.76 ppm. Therefore, the NMR analysis results show that compound III synthesized in Scheme 3 is {4-[1-(2,2,6,6-Tetramethyl-piperidine-1-yloxy)-ethyl]-benzyl}-phosphonic acid bis-(2-trimethylsilylethyl) ester having a nitroxide group bound to a 1$^{st}$ position of a benzene ring and phosphonate bound to a 4$^{th}$ position of the benzene ring. The nitroxide group is used as an initiator in Scheme 4, which is further described below.

Fourth Synthesis Method

Figure 5:
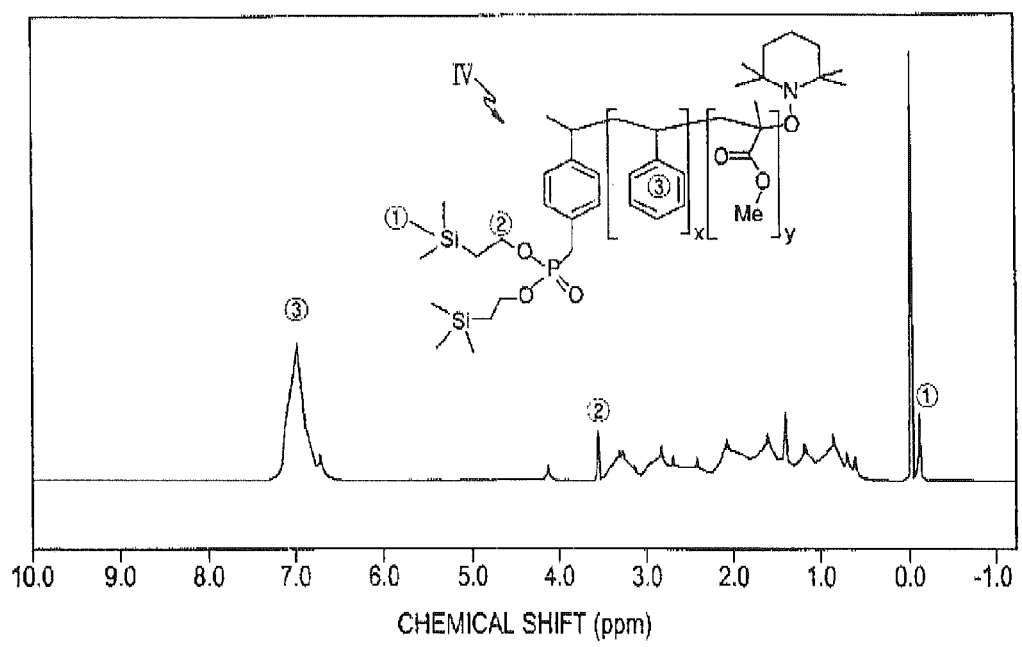
FIG. 5 is a $^1$H-NMR analysis spectrum for a bis[2-(trimethylsilyl)ethyl] phosphonate PS-PMMA random copolymer (IV) synthesized in Scheme 4.

Hereinafter, a method of manufacturing a precursor of compound V, which is further described below, more particularly a bis[2-(trimethylsilyl)ethyl] phosphonate PS-PMMA random copolymer, and a structure of the precursor of compound V will be described in detail with reference to Scheme 4 and FIG. 5. Compound IV synthesized in Scheme 4 is manufactured by polymerizing compound III synthesized in Scheme 3. Scheme 4 is designed to manufacture the bis[2-(trimethylsilyl)ethyl] phosphonate PS-PMMA random copolymer. FIG. 5 shows a $^1$H-NMR spectrum for a bis[2-(trimethylsilyl)ethyl] phosphonate PS-PMMA random copolymer (IV) synthesized in Scheme 4.

Scheme 4

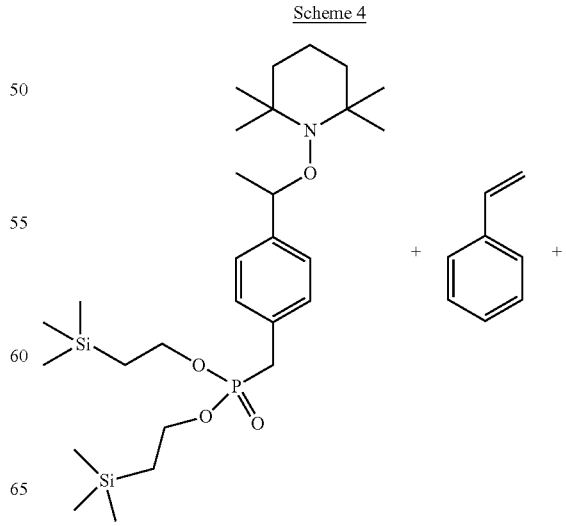

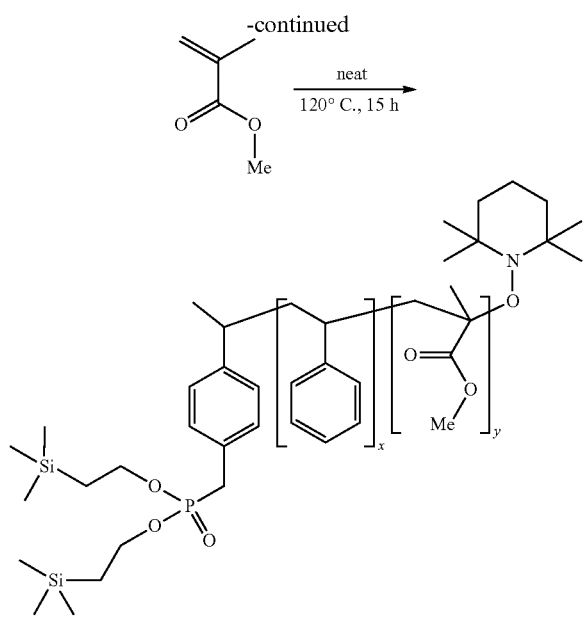

Compound III (662 mg, 1.2 mmol) synthesized in Scheme 3, styrene (10.4 g, 99.5 mmol), and methyl methacrylate (7.5 g, 74.9 mmol) are put into a Schlenk flask, and oxygen removed to provide a nitrogen atmosphere. The process of removing oxygen may include freezing, evacuation, and thawing cycles. After the oxygen in the Schlenk flask is removed, the Schlenk flask is heated to approximately 120° C., and materials included in the Schlenk flask are stirred for approximately 15 hours, thereby manufacturing a mixture IV-1. Thereafter, the Schlenk flask is cooled to room temperature, and the mixture IV-1 is diluted with tetrahydrofuran ("THF") (30 ml) to manufacture a solution IV-2.

The solution IV-2 is dropped into methanol (200 ml), and a polymer including the bis[2-(trimethylsilyl)ethyl] phosphonate PS-PMMA random copolymer is precipitated. The polymer is filtered and vacuum-dried to synthesize a white powder (compound IV) (7.8 g, 72%, 10,000 g/mol) as shown in Scheme 4. Compound IV is a bis[2-(trimethylsilyl)ethyl] phosphonate PS-PMMA random copolymer. The molecular weight of compound IV is determined by gel permeation chromatography ("GPC") analysis.

Compound IV synthesized in Scheme 4 is analyzed with reference to FIG. 5. FIG. 5 shows a $^1$H-NMR spectrum for compound IV. As shown in FIG. 5, the NMR analysis results of compound IV are as follows: $^1$H-NMR (400 MHz, CDCl$_3$): δ −0.15 (br s, Si (CH$_3$)$_3$), 0.5 to 3.5 (m), 4.15 (br s, OCH$_2$CH$_2$Si (CH$_3$)$_3$), 6.7 to 7.3 (br m, ArH). Here, br m represents a broad multiple peak. In particular, it is confirmed that a methyl group is bound to silicon through a broad single peak observed at approximately −0.15 ppm. It is confirmed that hydrogen of PMMA and hydrogen of the main chain (e.g., polymer backbone) are bound to the random copolymer through multiple peaks observed at approximately 0.5 to 3.5 ppm. Also, it is confirmed that benzene rings are present in the random copolymer through broad single peaks observed at approximately 6.7 to 7.3 ppm.

Therefore, the NMR analysis results show that compound IV synthesized in Scheme 4 is a bis[2-(trimethylsilyl)ethyl] phosphonate PS-PMMA random copolymer. The main chain of the bis[2-(trimethylsilyl)ethyl] phosphonate PS-PMMA random copolymer is formed by randomly binding styrene (PS) and methyl methacrylate (MMA) to each other. Also, the bis[2-(trimethylsilyl)ethyl] phosphonate PS-PMMA random copolymer has phosphonate at a $4^{th}$ position of a benzene ring bound to one end thereof, and a nitroxide group bound to the other end thereof. The phosphonate includes (trimethylsilyl) ethyl ether. In Scheme 4, the PS and MMA are bound to each other so that the number (x) of PS and the number (y) of MMA can be in a ratio of approximately 56 to approximately 44. A ratio of x to y may be a ratio in a range of approximately 40 to approximately 60 to approximately 60 to approximately 40, specifically approximately 45 to approximately 55 to approximately 55 to approximately 45, more specifically approximately 50 to approximately 50. The random copolymer having the ratio of x to y selected as described above may be satisfactorily surface-modified into a neutral state. In an embodiment, the ratio of x to y is approximately 56 to approximately 44.

Fifth Synthesis Method

Hereinafter, a method of manufacturing a phosphonic acid PS-PMMA random copolymer, and a structure of the random copolymer will be described in further detail with reference to Scheme 5 and FIGS. 1 and 6. Scheme 5 is designed to manufacture the phosphonic acid PS-PMMA random copolymer. FIG. 1 shows a $^1$H-NMR spectroscopic analysis spectrum for a phosphonic acid PS-PMMA random copolymer (V) synthesized in Scheme 5.

Scheme 5

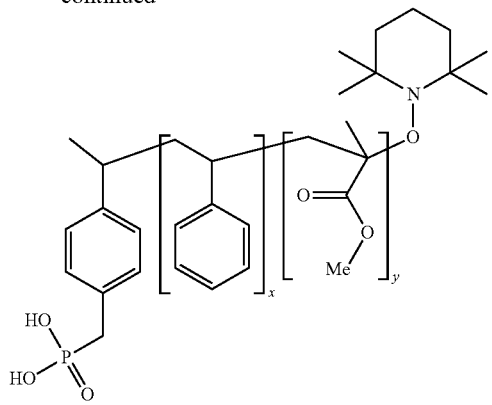

Compound IV (0.5 g, 0.05 mmol, Mn=10,000 g/mol) synthesized in Scheme 4 is dissolved in dichloromethane (DCM) (2 ml), and then stirred at approximately 0° C. for approximately 5 minutes to manufacture a solution V-1. Trimethylsilyl bromide ("TMSBr") (0.08 g, 0.5 mmol) is slowly added to the solution V-1, and stirred for approximately 2 hours to manufacture a mixture solution V-2. Hexane (20 ml) is added to the mixture solution V-2, and a polymer is precipitated. The precipitated polymer is purified through filtering, and vacuum-dried to obtain a white powder (compound V) (0.45 g, 90%) shown in Scheme 5. Compound V is a phosphonic acid PS-PMMA random copolymer.

Compound V synthesized in Scheme 5 is analyzed with reference to FIG. 1. As shown in FIG. 1, the NMR analysis results for compound V are as follows: $^1$H NMR (400 MHz, $CDCl_3$): δ 0.5 to 3.5 (m), 6.7 to 7.3 (br m, ArH). In particular, it is confirmed that hydrogen of PMMA and hydrogen of the main chain (e.g., polymer backbone) are bound to the random copolymer through multiple peaks observed at approximately 0.5 to 3.5 ppm. Also, it is confirmed that benzene rings are bound to the main chain of the random copolymer through broad single peaks observed at approximately 6.7 to 7.3 ppm. Therefore, the NMR analysis results confirm that compound V synthesized in Scheme 5 is a phosphonic acid PS-PMMA random copolymer. The phosphonic acid PS-PMMA random copolymer has a structure described above with reference to FIG. 1.

Figure 6:
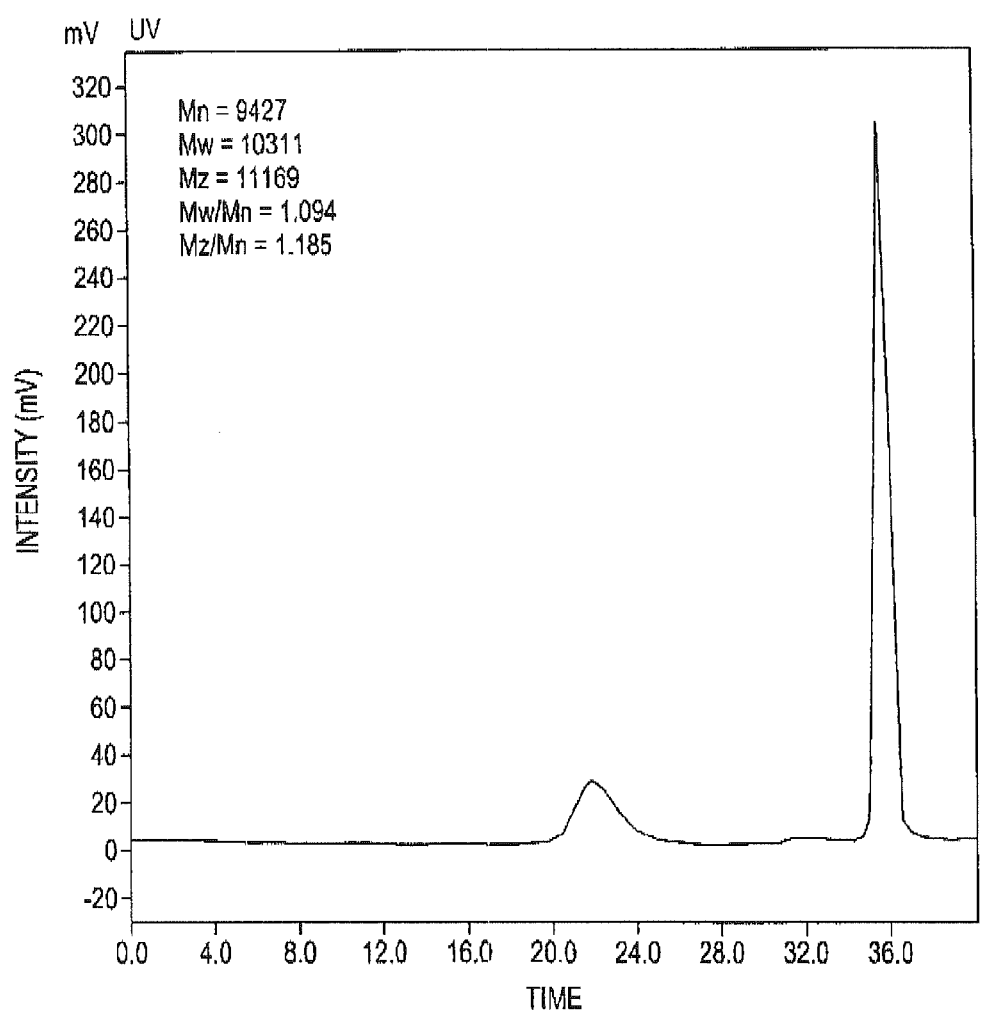
FIG. 6 shows the results of gel permeation chromatography ("GPC") analysis of a phosphonic acid PS-PMMA random copolymer synthesized in Scheme 5.

FIG. 6 shows the gel permeation chromatography ("GPC") analysis results for the phosphonic acid PS-PMMA random copolymer synthesized in Scheme 5. A sample obtained by mixing 2 milligrams (mg) of the phosphonic acid PS-PMMA random copolymer with 1 ml of a chloroform ($CHCl_3$) solvent was used for GPC analysis (Sykam S1122 model, Sykam GmbH). The GPC analysis results show that the synthesized phosphonic acid PS-PMMA random copolymer has a number average molecular weight (Mn) of approximately 9,427, a weight average molecular weight (Mw) of 10,311, and a polydispersity index (PDI) of approximately 1.09. The phosphonic acid PS-PMMA random copolymer may have a number average molecular weight (Mn) of approximately 5,000 to approximately 20,000, a weight average molecular weight (Mw) of approximately 5,000 to approximately 20,000, and a polydispersity index ("PDI") of approximately 1.0 to approximately 2.0, which is defined by Mw/Mn. Therefore, it can be seen that the phosphonic acid PS-PMMA random copolymer is a well-defined random copolymer.

FIG. 7 shows the results of analyzing compound IV and compound V synthesized in Schemes 4 and 5 using thin layer chromatography ("TLC"). An eluent of THF and a staining solution of phosphomolybdic acid were used. A TLC plate used silica gel (60 F254 glass plate, Merck). A reference polymer (represented by "REF" in FIG. 7) was a hydroxyl-terminated PS-PMMA random copolymer (HTPS-PMMA random copolymer). Samples of the reference polymer (REF), compound IV and compound V were manufactured by mixing 2 mg of each of the reference polymer (REF), compound IV and compound V with 1 ml of a $CHCl_3$ solvent. From the results shown in FIG. 7, it was confirmed that compound V synthesized in Scheme 5 (represented by "V" in FIG. 7) interacts more strongly with silica than compound IV (represented by "IV" in FIG. 7) and the reference polymer (HTPS-PMMA random copolymer). Also, it can be seen that a trimethylsilylethyl group is deprotected from phosphonate of compound IV to generate a phosphonic acid. Retention factors (Rfs) of the reference polymer, compound IV and compound V, which respectively represent interactions between the silica and the reference polymer, compound IV and compound V, are approximately 0.60 to approximately 0.90, approximately 0.65 to approximately 0.90, and approximately 0.00 to approximately 0.50, respectively. Here, an Rf value refers to a ratio of a distance traveled by a solute to a distance traveled by an eluent.

Figure 8C:
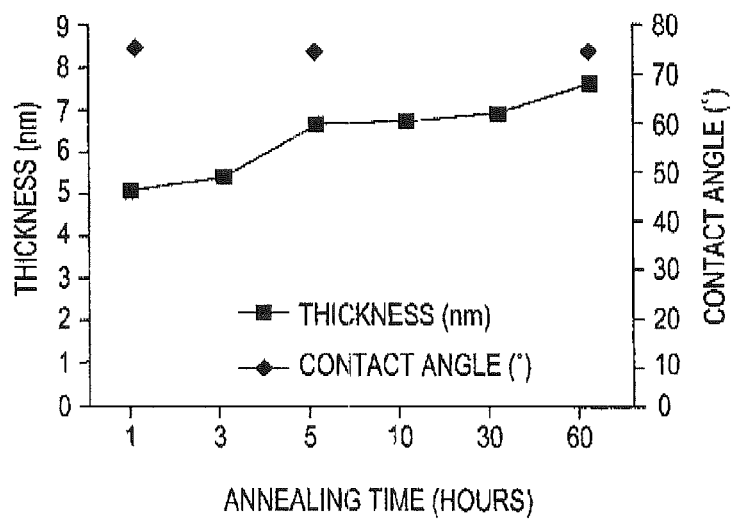
Figure 9:
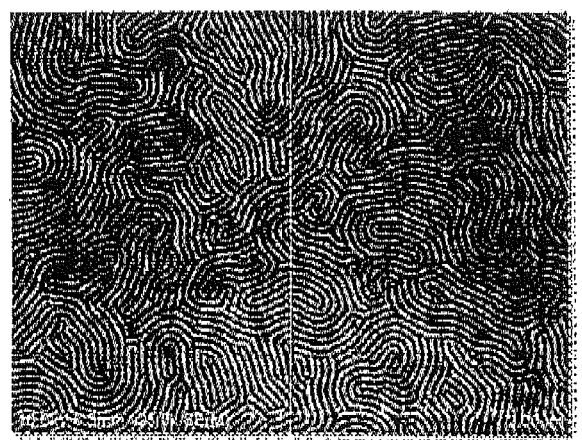
FIG. 9 is a top view photograph of a block copolymer formed on the neutral layer formed from the phosphonic acid PS-PMMA random copolymer, when viewed from the top.

Hereinafter, a method of forming a layer, e.g., a neutral layer, comprising a phosphonic acid PS-PMMA random copolymer as shown in FIG. 1, and characteristics of the neutral layer formed by the method will be described in further detail with reference to FIGS. 8A to 9. FIGS. 8A and 8B are photographs taken with an optical microscope, showing a contact angle between a neutral layer and water when the neutral layer is formed and subjected to ultrasonic analysis. FIG. 8C is a graph showing a variation in thickness and contact angle of the neutral layer as a function of annealing time to form a neutral layer. FIG. 9 shows a top photograph of a block copolymer disposed on the neutral layer.

In addition to the detailed description of the method of using a phosphonic acid PS-PMMA random copolymer, the neutral layer comprising the phosphonic acid PS-PMMA random copolymer was manufactured and evaluated, as will be further described below. The phosphonic acid PS-PMMA random copolymer having the structure shown in FIG. 1 was dissolved in a solvent such as propyleneglycol methylether acetate ("PMA") to approximately 1 wt % to prepare a random copolymer solution. The random copolymer solution was coated to a thickness of approximately 20 nanometers (nm) on a substrate including SiOx by spin coating at approximately 3,000 revolutions per minute ("rpm"). The coating of the random copolymer solution was annealed at approximately 160° C. for approximately 5 minutes to form a neutral layer. After the annealing, the formed neutral layer was washed with an organic solvent, and the random copolymer which was not bound to the substrate was removed with the organic solvent. The phosphonic acid PS-PMMA random copolymer having the structure shown in FIG. 1 may be heat-treated at approximately 100° C. or higher, e.g., approximately 50° C. to approximately 350° C., specifically approximately 70° C. to approximately 300° C., to form a neutral layer. A solvent used to dissolve the phosphonic acid PS-PMMA random copolymer may be at least one selected from propylene glycol methyl ether acetate ("PMA"), tetrahydrofuran ("THF"), dichloromethane ($CH_2Cl_2$), acetone, toluene, benzene, xylene, propylene glycol monomethyl ether acetate ("PGMEA"), dimethyl sulfoxide (DMSO), dimethylformamide (DMF), anisole, and a combination thereof.

The neutral layer formed in this way was measured for a contact angle and thickness, as shown in FIGS. 8A to 8C. FIG. 8A is a photograph taken of a contact angle between the neutral layer and water immediately after forming the neutral layer. FIG. 8B is a photograph taken of a contact angle between the neutral layer and water after immersing a substrate on which a neutral layer is formed in a toluene solution and sonicating the substrate for approximately 60 minutes. Before the sonication, the contact angle of the neutral layer was approximately 74°. It was confirmed that the neutral layer formed from the phosphonic acid PS-PMMA random copolymer shows a good neutral property. After the sonication, the contact angle of the neutral layer was approximately 74°. The contact angle of the neutral layer hardly changed before/after the sonication. From these facts, it was revealed that the neutral layer had good coherence to an underlying film, and the surface properties of the neutral layer were not changed. A contact angle represents a contact state between two materials. As measured in one experiment, a contact angle (θ) is an angle formed between the interface of the neutral layer and a waterdrop, which was measured after the waterdrop was dropped onto a surface of the neutral layer. FIG. 8C shows variations in contact angle and thickness of a neutral layer as an annealing time goes by under a nitrogen atmosphere at 160° C. after forming the neutral layer. As shown in FIG. 8C, the thickness and contact angle were hardly changed as the annealing time went by. Therefore, as the annealing time increases, a content of the random copolymer binding to the substrate is increased, so that the neutral layer has an increased density and shows excellent reliability. In a test measuring the variation in thickness of the neutral layer according to the annealing time, samples of the neutral layers which were not washed with an organic solvent were annealed, and the neutral layer samples were washed with an organic solvent when the neutral layers were measured for thickness according to the annealing time. Then, the neutral layers were measured for thickness and density. The thickness of the neutral layer was measured using ellipsometry. In order to evaluate the neutral properties of the neutral layer, a block copolymer was also formed on the neutral layer. The block copolymer was PS-block-PMMA ("PS-b-PMMA"). A weight average molecular weight (Mw) and a polydispersity index ("PDI") of the PS-b-PMMA were approximately 10 kg/mol and approximately 1.10, respectively. A mole fraction ratio of PS and PMMA was approximately 57:43. The block copolymer was heat-treated at approximately 250° C. for approximately 2 hours under a vacuum or nitrogen atmosphere. Thereafter, the block copolymer was phase-separated and aligned. An image of the aligned block copolymer was taken with an atomic force microscope ("AFM"). As shown in FIG. 9, it can be seen that the block copolymer formed on the neutral layer of the phosphonic acid PS-PMMA random copolymer has a well-aligned, perpendicular lamellar shape.

Hereinafter, a method of manufacturing a nanopattern substrate having a nanopattern using the phosphonic acid PS-PMMA random copolymer having the structure shown in FIG. 1, and a nanopattern substrate will be described in further detail with reference to FIGS. 10 to 11L. Hereinafter, a nanopattern substrate having a very small number of nanopatterns and a method of manufacturing the same will be described in further detail. However, the disclosed concept may be applied to a nanopattern substrate having a larger number of nanopatterns.

Figure 10A:
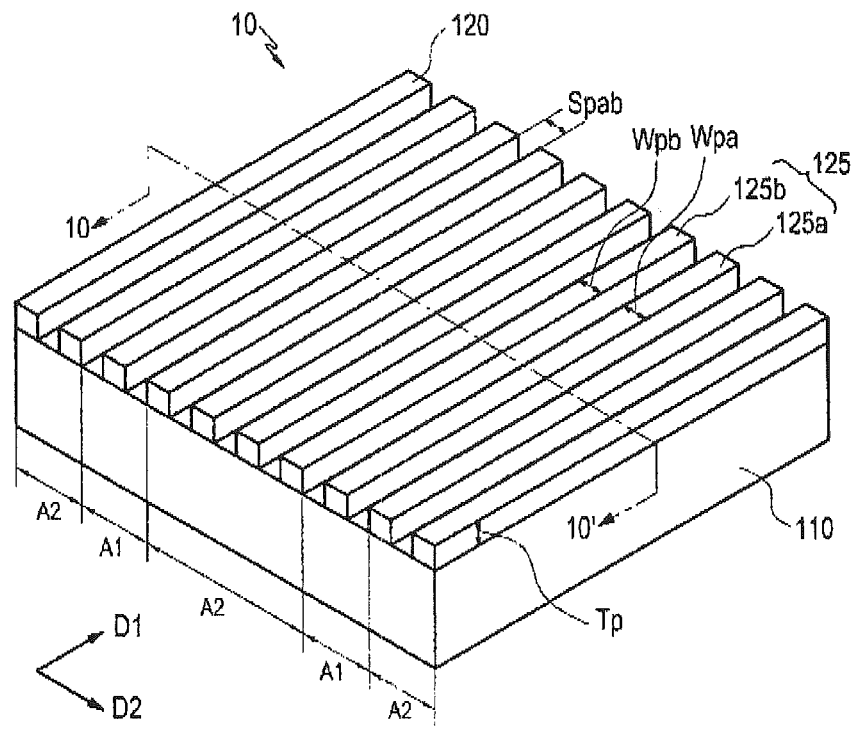
FIG. 10A is a perspective view of an embodiment of a nanopattern substrate.
Figure 10B:
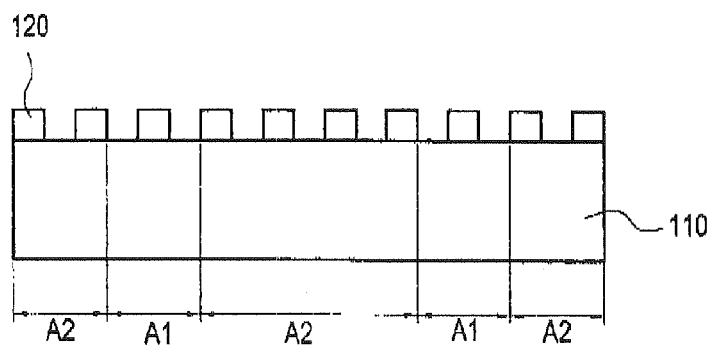
FIG. 10B is a cross-sectional view taken along line 10-10' in FIG. 10A.

FIG. 10A is a perspective view of a nanopattern substrate manufactured. FIG. 10B is a cross-sectional view taken along line 10-10' in FIG. 10A. Hereinafter, the nanopattern substrate will be described in further detail with reference to FIGS. 10A and 10B. The nanopattern substrate 10 shown in FIG. 10A includes line lattice patterns 125 formed on a base substrate 110 as metal patterns. The line lattice patterns 125 include first lines 125a formed to extend in a first direction D1, and second lines 125b spaced apart in the first direction D1 and a vertical direction (a direction D2) and formed to extend in the first direction D1. The line lattice patterns 125 were formed on the base substrate 110 at a certain length, and formed of a metal arranged at a frequency very much smaller than a wavelength of light. Widths Wpa and Wpb of the first lines 125a and the second lines 125b may be approximately 60 nm or less, and more preferably in a range of approximately 25 nm to approximately 40 nm, respectively. Gaps Spab between the adjacent first and second lines 125a and 125b may be approximately 60 nm or less, and more preferably in a range of approximately 25 nm to approximately 40 nm. Thicknesses Tp of the first lines 125a and the second lines 125b may be in a range of approximately 50 nm to approximately 500 nm, and more preferably in a range of approximately 100 nm to 200 nm. Line lattice patterns 125 formed on a second region A2 and a first region A1 were continuously formed. Since such line lattice patterns 125 are disposed at a gap Spab smaller than a visible wavelength, a polarizer capable of polarizing light may be used. The line lattice patterns 125 may comprise a metal, for example a metal selected from aluminum (Al), silver (Ag), and platinum (Pt). The line lattice patterns 125 formed of the metal may be used as a reflective polarizer. Therefore, the nanopattern substrate may be used as a polarizing plate of a liquid crystal display device or a reflective polarizing plate of a reflective liquid crystal display device to polarize light. Also, the nanopattern substrate may include a thin film transistor or a color filter formed on or under the line lattice patterns 125. Therefore, the nanopatterns having polarization properties may be manufactured together with the thin film transistor ("TFT") or color filter ("CF"), thereby reducing the manufacturing costs of display devices.

Figure 11A:
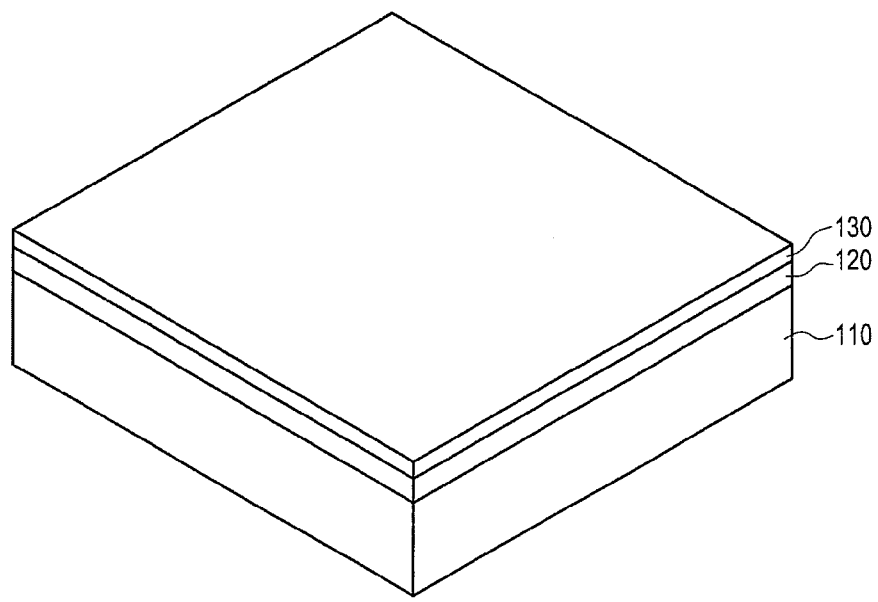
FIGS. 11A to 11L are perspective views explaining an embodiment of a method of manufacturing a nanopattern substrate as shown in FIGS. 10A and 10B.

Hereinafter, a method of manufacturing a nanopattern substrate 10 will be described in detail with reference to FIGS. 11A to 11L. FIGS. 11A to 11L are perspective views explaining methods of manufacturing the nanopattern substrate 10 as shown in FIGS. 10A and 10B. Referring to FIG. 11A, a metal layer 120 is formed on a base substrate 110 made of a glass or plastic material. The metal layer 120 may be comprise at least one metal selected from aluminum (Al), silver (Ag), and platinum (Pt). The metal layer 120 was formed of aluminum (Al) to a thickness of approximately 110 nm. The metal layer 120 may be formed to a thickness of approximately 50 nm to approximately 500 nm. An insulation layer 130 is formed on the metal layer 120. The insulation layer 130 may comprise silicon nitride (SiNx), silicon oxide (SiOx) or an organic insulating film. The insulation layer 130 was formed of silicon oxide (SiOx).

Figure 11B:
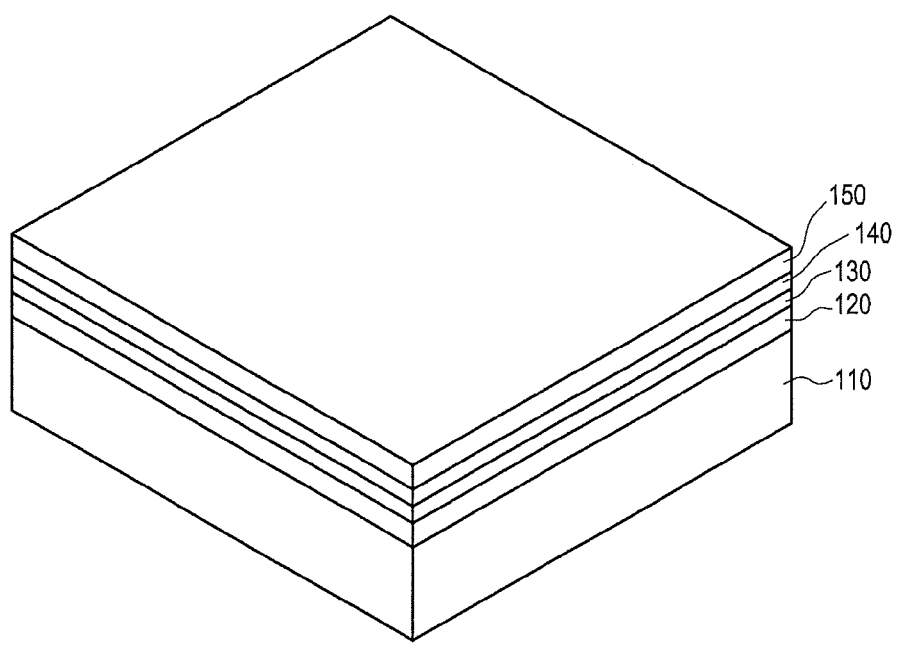

Referring to FIG. 11B, a method of forming a neutral layer 140 and a photoresist film 150 will be described in further detail. First, a random copolymer is applied onto the insulation layer 130. Then, the random copolymer is bound to the insulation layer 130 to become a neutral layer 140 using heat or UV rays. The random copolymer was a phosphonic acid PS-PMMA random copolymer as shown in FIG. 1. Since the phosphonic acid PS-PMMA random copolymer was described in detail with reference to FIGS. 1 to 7, a further detailed description of the phosphonic acid PS-PMMA random copolymer is omitted to avoid redundancy of the description. The random copolymer was applied to a thickness of approximately 10 nm to 20 nm using spin coating. The random copolymer was heat-treated at approximately 160° C. for approximately 5 minutes. The heat-treated random copolymer was formed into a neutral layer 140 having a thickness of approximately 5 nm. According to an embodiment, since the random copolymer including a phosphonic acid is rapidly formed into the neutral layer 140, a processing time required to manufacture the neutral layer 140 is highly shortened. Since the neutral layer 140 does not substantially show hydrophilic or hydrophobic properties, respective blocks of the block copolymer formed on the neutral layer 140 may be aligned in a structure having a perpendicular lamellar shape, that is, in a structure vertical to a surface thereof along a thickness direction. According to another embodiment, the random copolymer may be applied to a thickness of approximately 5 nm to approximately 2 µm. The random copolymer may be heat-treated at approximately 100° C. to approximately 200° C. within approximately 20 minutes. Since the random copolymers which are not bound to the insulation layer 130 may be removed using heat-treatment or UV rays, a thickness of the applied random copolymer may be higher than that of the neutral layer after the random copolymer is formed into the neutral layer.

A photoresist film 150 is formed on the neutral layer 140. The photoresist film 150 may be formed of a material which is not damaged or removed when first sacrificial blocks B1 or second sacrificial blocks B2 are removed. The photoresist film 150 was formed of SU8 (Microchem Corp., MA, USA). The photoresist film 150 may be formed to a thickness of approximately 500 nm to approximately 2 µm. According to another embodiment, the photoresist film 150 may be formed of at least one material selected from a novolac-based resin, polyvinylphenol ("PVP"), acrylate, a norbomene polymer, polytetrafluoroethylene ("PTFE"), a silsesquioxane polymer, PMMA, a terpolymer, poly(1-butene sulfone) ("PBS"), a novolac-based positive electron resist ("NPR"), poly(methyl-a-chloroacrylate-co-a-methyl styrene, poly(glycidyl methacrylate-co-ethyl acrylate), polychloromethylstyrene ("PCMS"), and a combination thereof. Also, the photoresist film 150 may be formed of a material generally used for manufacture of semiconductors or liquid crystal display devices. According to another embodiment, the photoresist film 150 may be formed of another material having a hydrophilic or hydrophobic property.

Figure 11C:
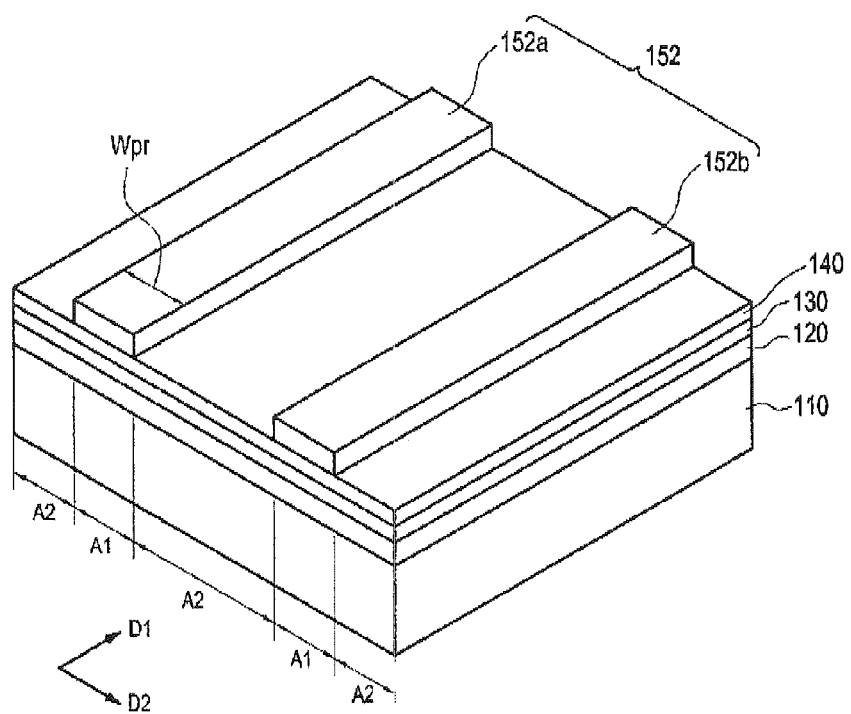

Hereinafter, a pattern 152 of the photoresist film 150 will be described in further detail with reference to FIG. 11C. The pattern 152 of the photoresist film 150 modulates directionality of the block copolymer. As an aspect ratio of the pattern 152 of the photoresist film 150 becomes higher, a correlation length of the block copolymer is increased, which facilitates an arrangement of the block copolymer. The pattern 152 of the photoresist film 150 includes a first partition 152a and a second partition 152b. The first partition 152a and the second partition 152b are formed in the first region A1. The first partition 152a and the second partition 152b extend in a first direction D1, and are disposed a certain distance apart in a second direction D2. The pattern 152 of the photoresist film 150 may have a width Wpr of approximately 50 nm to approximately 2 µm. A distance between the first partition 152a and the second partition 152b may be in a range of approximately 500 nm to approximately 3 µm. The second region A2 refers to a region in which a photoresist film is removed to expose the neutral layer 140.

The pattern 152 of the photoresist film 150 was formed using a photolithography process. That is, a mask was used to irradiate the photoresist film 150 with light, and a photoresist film was formed to form the pattern 152 of the photoresist film 150. A light source was an I-line having a wavelength of approximately 365 nm. According to another embodiment, the light source may be a G-line having a wavelength of approximately 436 nm, an H-line having a wavelength of approximately 405 nm, a KrF laser having a wavelength of approximately 248 nm, an ArF laser having a wavelength of approximately 193 nm, deep ultraviolet ("DUV") light, X-rays or electron beams using a wavelength of approximately 157 nm, or extreme ultraviolet rays having a wavelength of approximately 13.5 nm. According to another embodiment, the pattern 152 of the photoresist film 150 may be formed using a process such as soft lithography, nanoimprint lithography ("NIL") or scanning probe lithography.

Figure 11D:
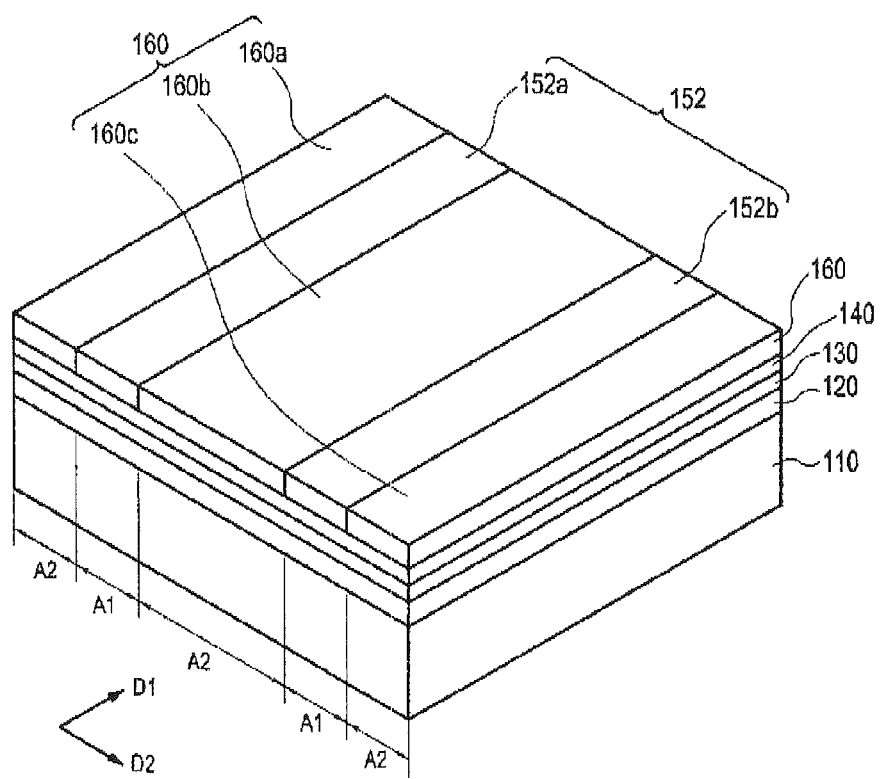
Figure 11E:
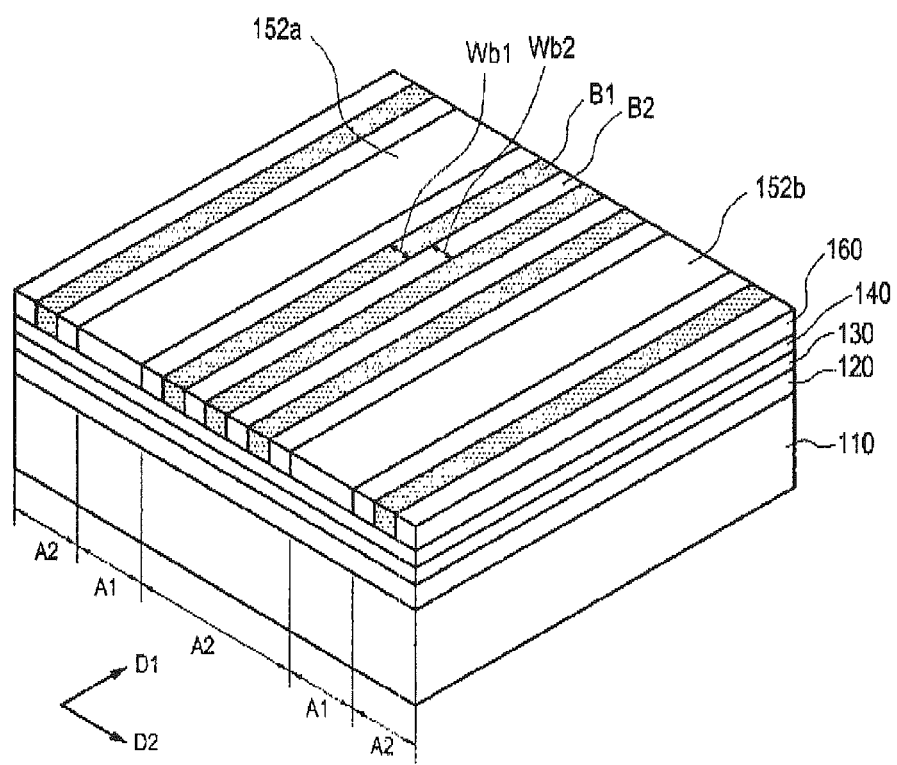

Referring to FIGS. 11D and 11E, a first block copolymer thin film 160 is formed from the first block copolymer formed on the second region A2. The first block copolymer thin film 160 includes block copolymer thin films 160a, 160b and 160c formed respectively in the three second region A2. The first block copolymer thin film 160 may be formed to a thickness of approximately 50 nm or more. The first block copolymer included PS-b-PMMA including PS as a first monomer and PMMA as a second monomer. The sum of molecular weights of the PS and PMMA was 130,000 g/mol, and a molecular weight ratio of the PS and PMMA was approximately 1:1. The first block copolymer refers to a polymer formed by binding two or more monomers, for example, a first monomer and a second monomer, through a covalent bond. The two monomers show different physical properties and chemical properties. The first monomer (B1 in FIG. 11E) has a relatively hydrophilic properties as compared to the second monomer (B2 in FIG. 11E), and the second monomer (B2 in FIG. 11E) has a relatively hydrophobic properties as compared to the first monomer (B1 in FIG. 11E). According to another embodiment of, the first block copolymer may include PS-block-poly(ethylene oxide) (PS-b-PEO), PS-block-poly(vinyl pyridine) (PS-b-PVP), PS-block-poly(ethylene-alt-propylene) (PS-b-PEP), or PS-block-polyisoprene (PS-b-PI).

Hereinafter, a first sacrificial nanostructure will be described in detail with reference to FIG. 11E. The first block copolymer thin film 160 is subjected to a first heat-treatment process. The first heat-treatment process was performed at approximately 250° C. for approximately 2 hours. A block copolymer included in the first block copolymer thin film 160 formed by the first heat-treatment process is phase-separated to form a first sacrificial nanostructure. The first sacrificial nanostructure has a perpendicular lamellar shape including first sacrificial blocks B1 and second sacrificial blocks B2. The first sacrificial blocks B1 and the second sacrificial blocks B2 extend in a first direction D1, and are disposed spaced apart in a second direction D2. Each of the first sacrificial blocks B1 is disposed between the adjacent second sacrificial blocks B2. In an embodiment, each of widths WB1 and WB2 of the first sacrificial blocks B1 and the second sacrificial blocks B2 was approximately 30 nm. Since PS which has hydrophobic properties binds to the pattern 152 of the photoresist film 150, the first sacrificial blocks B1 include PMMA, and the second sacrificial blocks B2 include PS. According to another embodiment, the first heat-treatment process may be performed at approximately 100° C. to approximately 300° C. for approximately 0.5 hours to approximately 60 hours. According to another embodiment of, the first sacrificial blocks B1 and the second sacrificial blocks B2 may be formed to have widths WB1 and WB2 of approximately 60 nm or less.

Figure 11F:
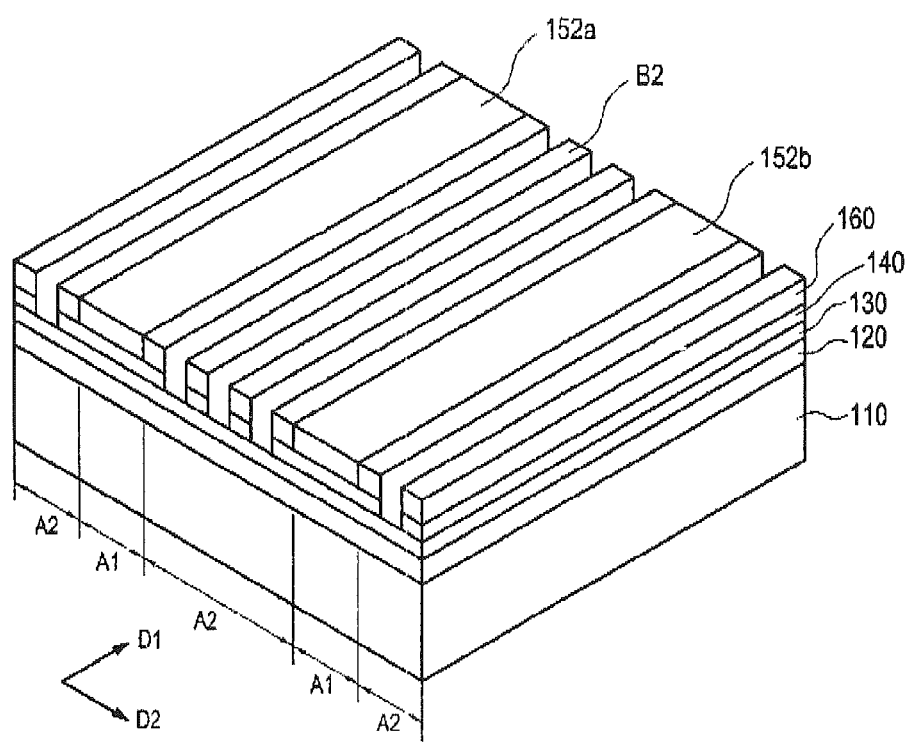

Hereinafter, a method of patterning the first sacrificial nanostructure and the neutral layer 140 will be described in further detail with reference to FIGS. 11F and 11G. Referring to FIG. 11F, the first sacrificial blocks B1 included in the first sacrificial nanostructure and the neutral layer 140 arranged below the first sacrificial blocks B1 are all removed. Therefore, a pattern is formed by the second sacrificial blocks B2, the neutral layer 140, the first partition 152a and the second partition 152b. The first sacrificial blocks B1, which constitute the first sacrificial nanostructure, and the neutral layer 140 arranged below the first sacrificial blocks B1 were sequentially removed by reactive ion etching ("RIE") using an oxygen gas. According to another embodiment, the first sacrificial blocks B1, which constitute the first sacrificial nanostructure, and the neutral layer 140 arranged below the first sacrificial blocks B1 may be independently removed. According to another embodiment, the first sacrificial blocks B1 including PMMA may be selectively removed using wet etching. According to the wet etching, when the base substrate 110 including the first sacrificial nanostructure is immersed in a solution including acetic acid and sonicated, only the first sacrificial blocks B1 may be selectively removed. According to another embodiment, the first sacrificial blocks B1 constituting the first sacrificial nanostructure may be selectively removed by irradiation of UV rays. The neutral layer 140 may be oxidized by means of selective ion etching using oxygen plasma, a UV ozone generator or X rays, for example.

Figure 11G:
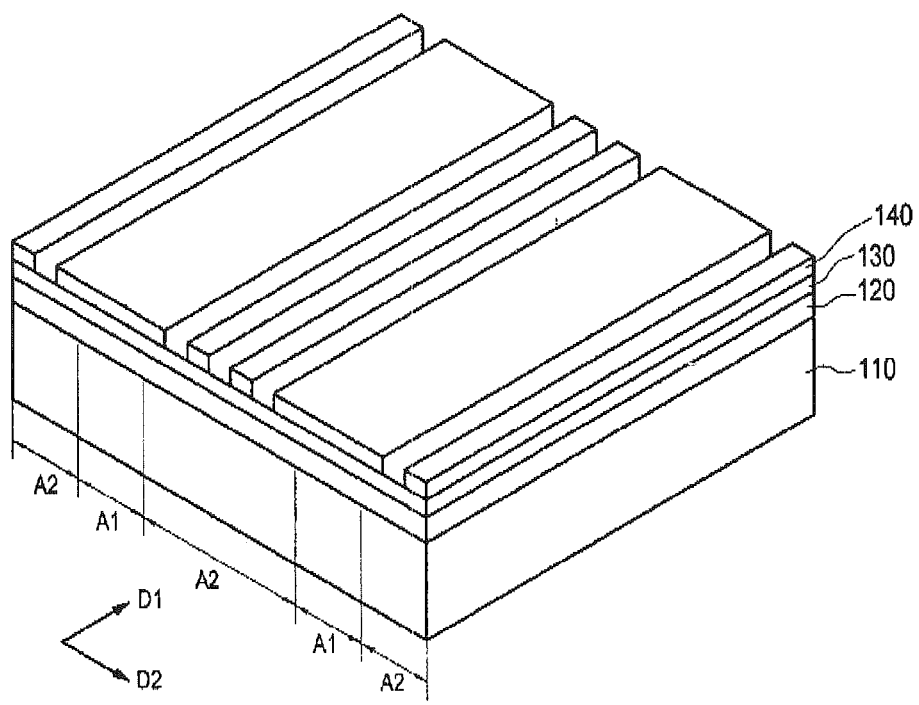

Referring to FIG. 11G, the second sacrificial blocks B2 and the pattern 152 of the photoresist film 150 are removed. The neutral layer 140 and the insulation layer 130 are then exposed. A pattern width of the neutral layer 140 formed in the first region A1 is substantially similar to a width of the first sacrificial blocks B1. The insulation layer 130 is exposed from a region from which the neutral layer 140 is removed. The base substrate 110 including the second sacrificial blocks B2 and the pattern 152 of the photoresist film 150 was immersed in a solution including toluene and sonicated, and the second sacrificial blocks B2 and the pattern 152 of the photoresist film 150 were removed.

Figure 11H:
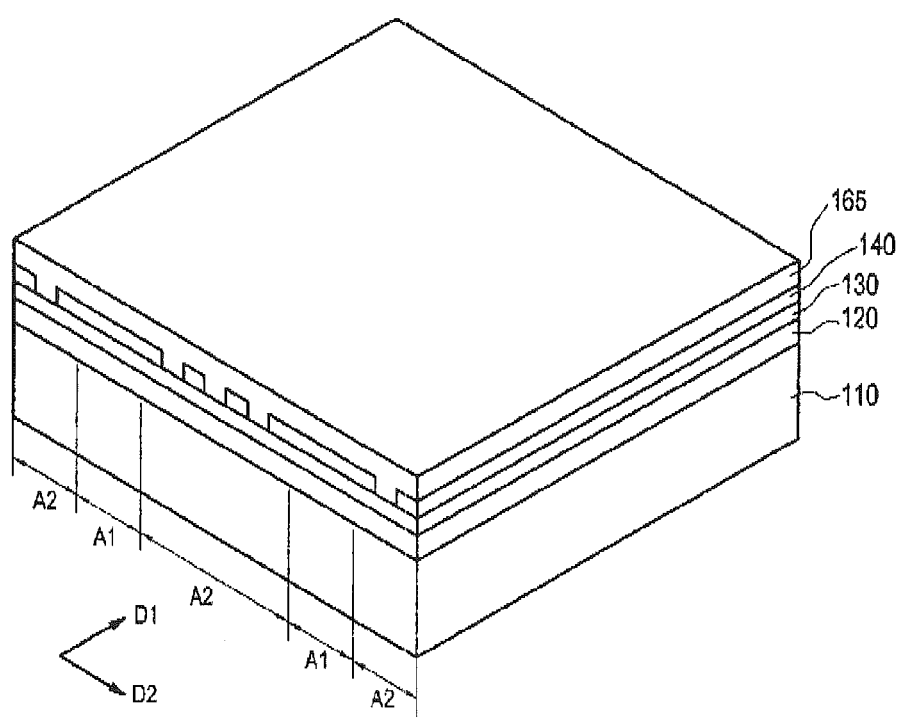

Hereinafter, a method of forming a second sacrificial nanostructure will be described in further detail with reference to FIG. 11H. Referring to FIG. 11H, the second block copolymer is formed on the entire surfaces of the insulation layer 130 and the neutral layer 140 to form a second block copolymer thin film 165 including a second block copolymer. The second block copolymer is substantially identical to the first block copolymer.

Figure 11I:
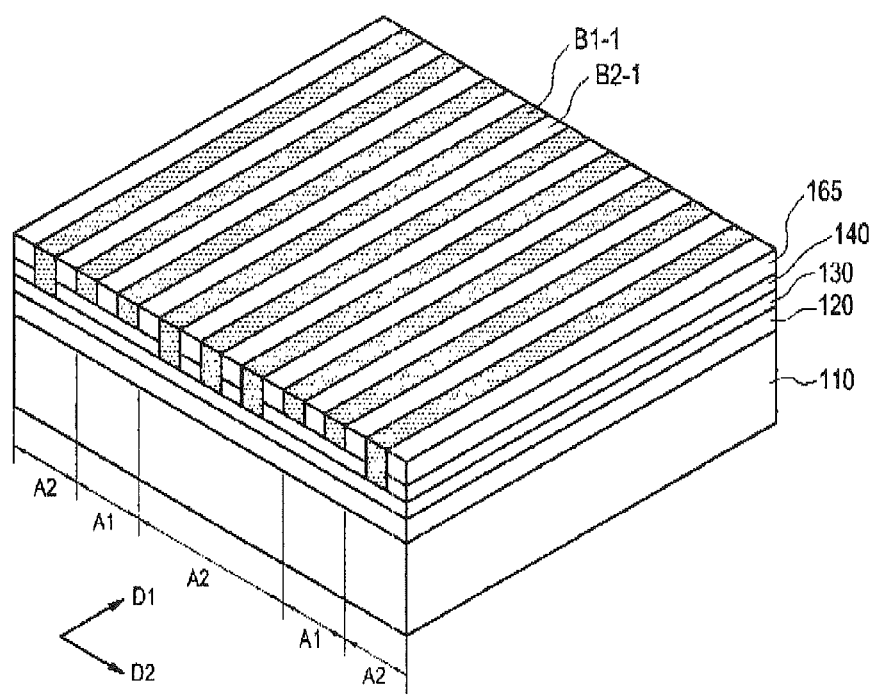

Referring to FIG. 11I, a second sacrificial nanostructure is formed. The second block copolymer thin film 165 described with reference to FIG. 11H is phase-separated by a second heat-treatment process to form the second sacrificial nanostructure. The second sacrificial nanostructure has a perpendicular lamellar shape including third sacrificial blocks B1-1 and fourth sacrificial blocks B2-1. The second sacrificial nanostructure is substantially identical to the first sacrificial nanostructure. The third sacrificial blocks B1-1 and the fourth sacrificial blocks B2-1 extend in a first direction D1, and are arranged spaced apart in a second direction D2. Each of the third sacrificial blocks B1-1 is disposed between the adjacent fourth sacrificial blocks B2-1. The third sacrificial blocks B1-1 are formed at substantially the same position at which the first sacrificial blocks B1 were formed, and the fourth sacrificial blocks B2-1 are formed at substantially the same position at which the second sacrificial blocks B2 were formed. A width of the third sacrificial blocks B1-1 is substantially the same as that of the first sacrificial blocks B1, and a width of the fourth sacrificial blocks B2-1 is substantially the same as that of the second sacrificial blocks B2. Since the PMMA binds to the insulation layer 130 formed in edges of the first regions A1 and having a hydrophilic property, the third sacrificial blocks B1-1 include the PMMA, and the fourth sacrificial blocks B2-1 include the PS due to the coupling of the PMMA. Due to the coupling of the block copolymer arranged at edges of the second regions A2 adjacent to the edges of the first regions A1, the block copolymer may be phase-separated into the third sacrificial blocks B1-1 and the fourth sacrificial blocks B2-1 toward the central regions of the first regions A1 and the second regions A2. The second heat-treatment process is substantially the same as the first heat-treatment process.

Figure 11J:
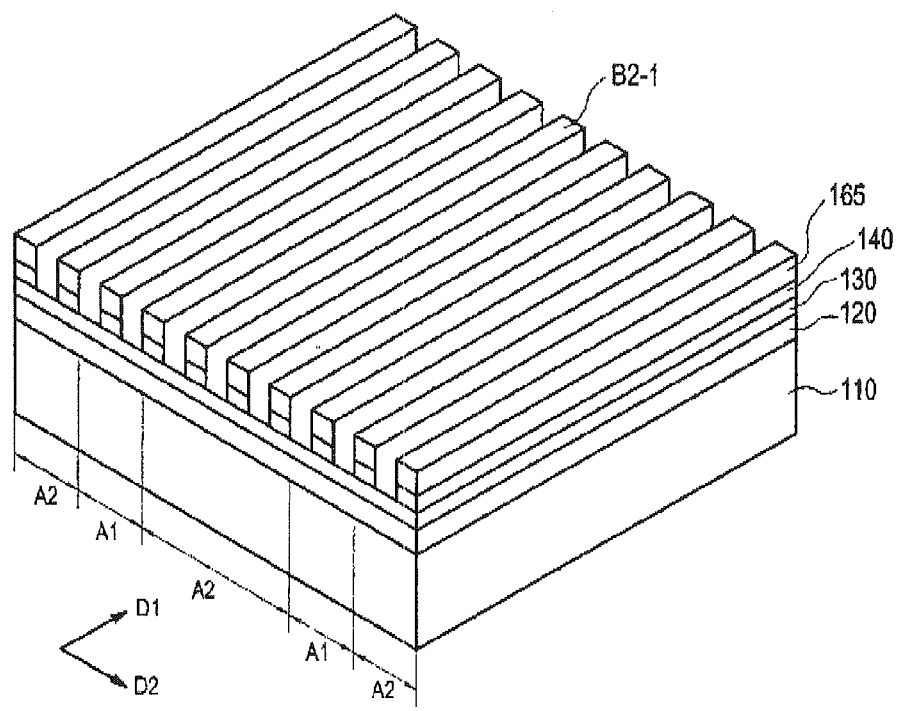

Referring to FIG. 11J, the third sacrificial blocks B1-1 of the second sacrificial nanostructure and the neutral layer 140 overlapping the third sacrificial blocks B1-1 are removed, and the fourth sacrificial blocks B2-1 remain intact. The third sacrificial blocks B1-1 including the PMMA and the neutral layer 140 arranged below the regions of the third sacrificial blocks B1-1 may be removed using the methods described above with reference to FIG. 11F. The fourth sacrificial blocks B2-1 and the neutral layer 140 arranged below the regions of the fourth sacrificial blocks B2-1 remain intact. Therefore, the same pattern as the first sacrificial nanostructure formed in the first region A1 is also formed in the second region A2 by the neutral layer 140 and the PS film. The patterns of the sacrificial nanostructures, which are formed in the second regions A2 and the first region A1, may be uniformly formed in a continuous manner.

Figure 11K:
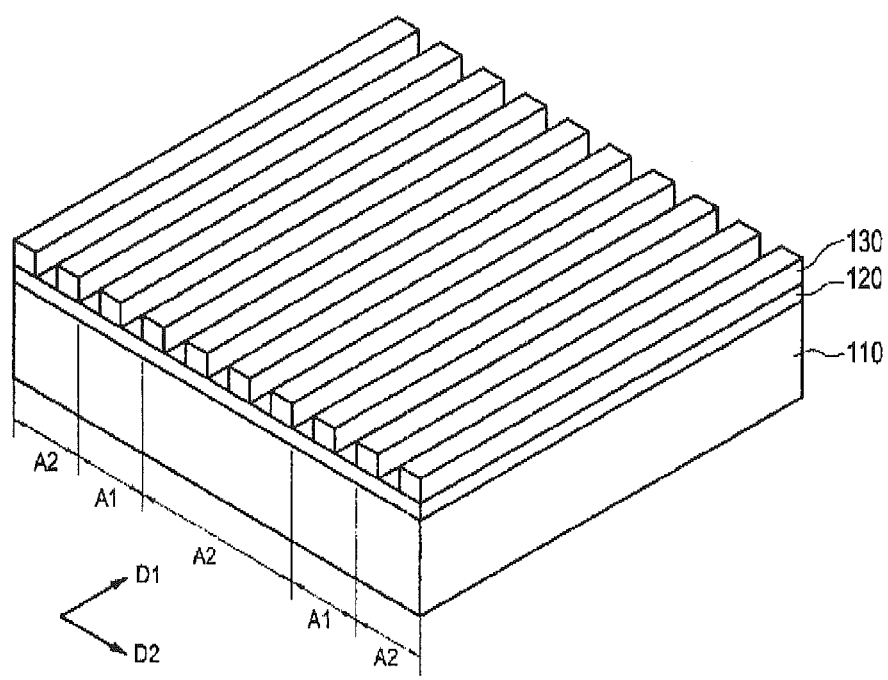

Referring to FIG. 11K, a pattern of the insulation layer 130 will be described in further detail. The insulation layer 130 is patterned using the fourth sacrificial blocks B2-1 of the second sacrificial nanostructure as a mask. The metal layer 120 is exposed from a region from which the insulation layer 130 is removed. A width of the pattern in which the insulation layer 130 remains intact is substantially the same as that of the fourth sacrificial blocks B2-1, and a width of the pattern in which the insulation layer 130 is removed is substantially the same as that of the third sacrificial blocks B1-1. The fourth sacrificial blocks B2-1, the neutral layer 140 and the insulation layer 130 may be removed at the same time by RIE using a fluorine-based gas.

Figure 11L:
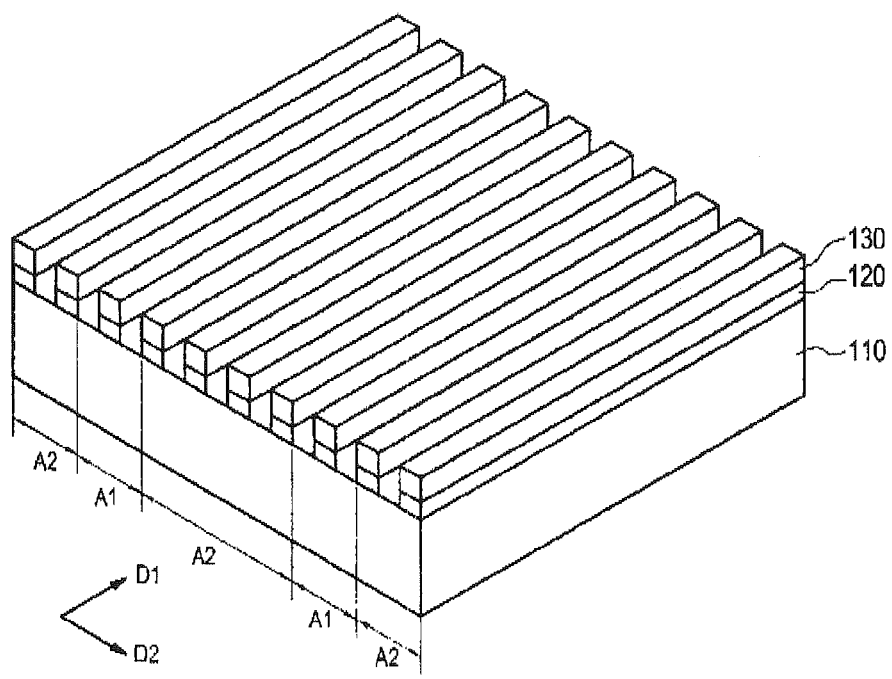

Referring to FIG. 11L, the metal layer 120 is patterned using the pattern of the insulation layer 130 as a mask. When the insulation layer 130 formed on the metal layer 120 is removed, a nanopattern substrate including metal patterns patterned with lattice-shaped lines is manufactured, as shown in FIGS. 8A and 8B. Since the metal patterns patterned with the lattice-shaped lines have already been described with reference to FIGS. 8A and 8B, a further detailed description of the metal patterns is omitted for clarity.

According to an embodiment, since the random copolymer including a phosphoric acid is rapidly formed into a neutral layer 140, the processing time required to manufacture a nanopattern substrate can be shortened. According to another embodiment, nanopatterns having nano-sized lattice-type lines can be easily formed on a large base substrate.

The random copolymer including a phosphonic acid and having the structure shown in FIG. 1 may be useful in neutralizing surfaces of particles or a substrate. The particles or substrate may include a metal oxide such as titania, or a nonmetal material such as silica.

Since the random copolymer rapidly binds to the substrate or particles to form a neutral layer, the random copolymer may be used to highly improve productivity and processability of a nanopattern substrate.

Since the random copolymer including a phosphonic acid having a plurality of hydroxyl groups has covalent bonds formed through a dehydration reaction of the substrate or particles and the plurality of hydroxyl groups, the random copolymer may be useful in reducing a processing time to form a neutral layer.

Furthermore, the random copolymer may be used to form a nanopattern substrate on a substrate or particles through a rapid process, thereby improving productivity and processability. Hereinafter, it will be understood by those skilled in the art that these advantages, features, and aspects of the disclosed embodiments may be derived from the detailed description of this specification.

While the invention has been shown and described with reference to certain exemplary embodiments thereof, it will be understood by those skilled in the art that various changes in form and details may be made therein without departing from the scope of the invention as defined by the appended claims.

What is claimed is:
1. A random copolymer comprising a structure represented by Formula 1:

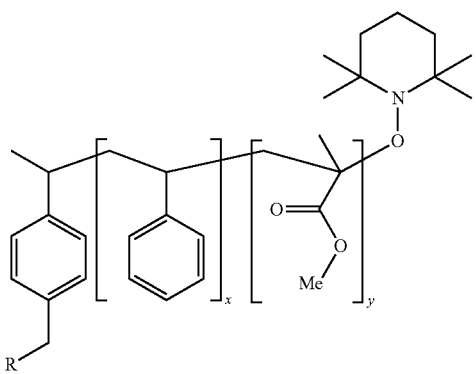

Formula 1 wherein R is phosphonic acid, Me is a methyl group, x is a number of styrene units, and y is a number of methyl methacrylate units.

2. The random copolymer according to claim 1, wherein the random copolymer has a number average molecular weight of 5,000 to 20,000 Daltons.

3. The random copolymer according to claim 1, wherein the random copolymer has a weight average molecular weight of 5,000 to 20,000 Daltons.

4. The random copolymer according to claim 1, wherein the random copolymer has a polydispersity index of 1.0 to 2.0.

5. The random copolymer according to claim 1, wherein x and y are present in a number ratio of 40 to 60 to 60 to 40.

6. A method of manufacturing a random copolymer, the method comprising
manufacturing a phosphonic acid precursor;
manufacturing a first nitroxide initiator for nitroxide-mediated radical polymerization;
manufacturing a second nitroxide initiator comprising a product of the phosphonic acid precursor by contacting the phosphonic acid precursor and the first nitroxide initiator;
manufacturing a precursor of a phosphonic acid polystyrene-poly(methyl methacrylate) random copolymer by contacting the second nitroxide initiator, a styrene unit precursor, and a methyl methacrylate unit precursor; and
deprotecting the precursor of a phosphonic acid polystyrene-poly(methyl methacrylate) random copolymer to manufacture the random copolymer,
wherein the random copolymer comprises a structure represented by Formula 1:

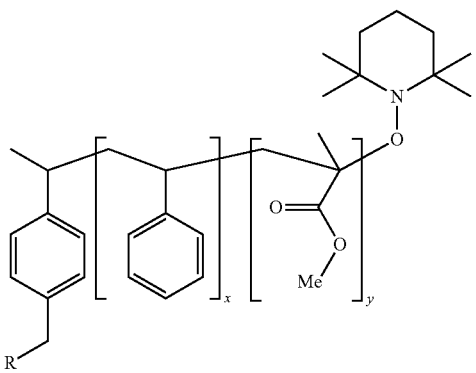

Formula 1 wherein R is phosphonic acid, Me is a methyl group, x is a number of styrene units, and y is a number of methyl methacrylate units.

7. The method according to claim 6, wherein the second nitroxide initiator is synthesized by reacting the phosphonic acid precursor and the first nitroxide initiator.

8. The method according to claim 7, wherein the phosphonic acid precursor is bis[2-(trimethylsilyl)ethyl] phosphonate.

9. The method according to claim 8, wherein the bis[2-(trimethylsilyl)ethyl] phosphonate is a product of 2-(trimethylsilyl)ethanol and phosphorus trichloride.

10. The method according to claim 7, wherein the first nitroxide initiator is 1-[1-(4-chloromethylphenyl)ethoxy]-2,2,6,6-tetramethyl-piperidine.

11. The method according to claim 10, wherein the 1-[1-(4-chloromethylphenyl)ethoxy]-2,2,6,6-tetramethyl-piperidine is a product of 4-vinylbenzyl chloride, 2,2,6,6-tetramethylpiperidinyloxy and di-tert-butylperoxide.

12. The method according to claim 7, wherein the second nitroxide initiator is {4-[1-(2,2,6,6-tetramethyl-piperidine-1-yloxy)-ethyl]-benzyl}-phosphonic acid bis-(2-trimethylsilylethyl) ester.

13. The method according to claim 12, wherein the {4-[1-(2,2,6,6-tetramethyl-piperidine-1-yloxy)-ethyl]-benzyl}-phosphonic acid bis-(2-trimethylsilylethyl) ester is a product of bis[2-(trimethylsilyl)ethyl] phosphonate and 1-[1-(4-chloromethylphenyl)ethoxy]-2,2,6,6-tetramethyl-piperidine.

14. The method according to claim 7, wherein the precursor of the phosphonic acid polystyrene-poly(methyl methacrylate) random copolymer is a bis[2-(trimethylsilyl)ethyl] phosphonate polystyrene-poly(methyl methacrylate) random copolymer.

15. The method according to claim 14, wherein the bis[2-(trimethylsilyl)ethyl] phosphonate polystyrene-poly(methyl methacrylate) random copolymer is a product of {4-[1-(2,2,6,6-tetramethyl-piperidine-1-yloxy)-ethyl]-benzyl}-phosphonic acid bis-(2-trimethylsilylethyl) ester, styrene and methyl methacrylate.

16. The method according to claim 7, wherein the deprotecting comprises
dissolving the bis[2-(trimethylsilyl)ethyl] phosphonate polystyrene-poly(methyl methacrylate) random copolymer in dichloromethane to manufacture the phosphonic acid polystyrene-poly(methyl methacrylate) random copolymer.

17. A method of manufacturing a nanopattern substrate, comprising:
disposing a metal layer on a substrate;
forming a neutral layer comprising a random copolymer represented by Formula 1 on the metal layer,

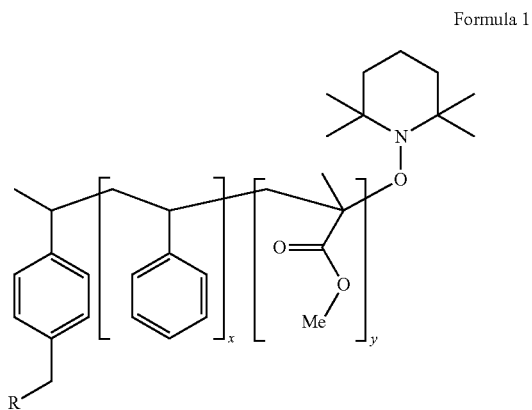

Formula 1 wherein R is phosphonic acid, Me is a methyl group, x is a number of styrene units, and y is a number of methyl methacrylate units;
disposing a first block copolymer including a first block and a second block on the neutral layer;
forming a first nanostructure corresponding to first nanoblocks comprising the first blocks and second nanoblocks comprising the second blocks; and
patterning the metal layer in substantially a same shape as the first nanoblocks or the second nanoblocks.

18. The method according to claim 17, wherein x and y are present in a number ratio of 40 to 60 to 60 to 40.

19. The method according to claim 17, further comprising:
disposing an insulation layer on the metal layer; and
forming partition patterns on the neutral layer.

20. The method according to claim 19, wherein the first nanostructure comprises a perpendicular lamellar shape and is formed between the partition patterns.

21. The method according to claim 20, further comprising:
forming a first neutral layer pattern which is substantially the same as a first nanoblock pattern or a second nanoblock pattern formed by a first etching process which comprises etching the first nanoblocks or the second nanoblocks.

22. The method according to claim 21, further comprising:
removing the partition patterns and the first nano structure, and
exposing a surface of the first neutral layer pattern to form an exposed first neutral layer pattern and insulation layer.

23. The method according to claim 22, further comprising:
disposing a second block copolymer including a third block and a fourth block on the exposed first neutral layer pattern and the insulation layer.

24. The method according to claim 23, further comprising:
forming a second nanostructure which corresponds to the third nanoblocks comprising the third blocks and fourth nanoblocks comprising the fourth blocks.

25. The method according to claim 24, wherein the third blocks are formed at a position at which at least one of the first nanoblocks is formed.

26. The method according to claim 25, further comprising:
forming a second neutral layer pattern which is substantially the same as a third nanoblock pattern or a fourth nanoblock pattern formed by a second etching process which comprises etching the third nanoblocks or the fourth nanoblocks.

27. The method according to claim 26, further comprising:
forming an insulation layer pattern on the insulation layer having substantially the same pattern as the second neutral layer pattern.

28. The method according to claim 27, further comprising:
forming a metal pattern on the metal layer having substantially the same pattern as the insulation layer pattern.

29. A method of forming a neutral layer comprising a random copolymer, the method comprising:
dissolving a random copolymer having a structure represented by Formula 1 in a solvent to form a solution,

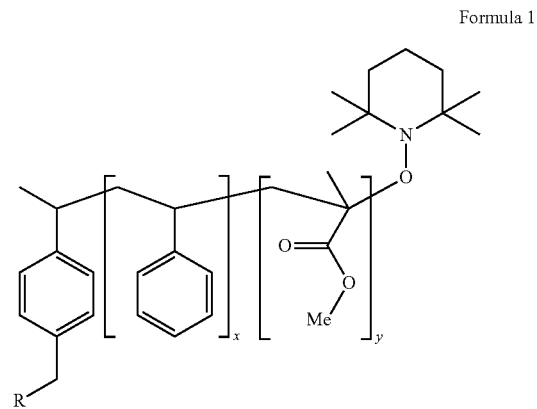

Formula 1 wherein R is phosphonic acid, Me is a methyl group, x is a number of styrene units, and y is a number of methyl methacrylate units;
coating the solution of the dissolved random copolymer on a substrate to form a coating; and
annealing the coating to neutralize a surface of the coating to form the neutral layer.

30. The method according to claim 29, wherein the solvent is selected from propyleneglycol methylether acetate, tetrahydrofuran, dichloromethane, acetone, toluene, benzene, xylene, propylene glycol monomethyl ether acetate, dimethyl sulfoxide, dimethylformamide, anisole, and a combination thereof.

31. The method according to claim 30, wherein the random copolymer is dissolved in the propyleneglycol methylether acetate at a concentration of 1 wt %, based on a total weight of the solution.

32. The method according to claim 29, wherein the annealing is performed at 100° C. or higher.

33. The method according to claim 32, wherein the annealing is performed at 160° C.

34. The method according to claim 33, further comprising:
   washing the surface of the random copolymer formed in the annealing process with an organic solvent.

* * * * *